(12) United States Patent
Kim et al.

(10) Patent No.: US 10,186,551 B1
(45) Date of Patent: Jan. 22, 2019

(54) BURIED TAP FOR A VERTICAL TRANSISTOR USED WITH A PERPENDICULAR MAGNETIC TUNNEL JUNCTION (PMTJ)

(71) Applicant: Spin Transfer Technologies, Inc., Fremont, CA (US)

(72) Inventors: Kuk-Hwan Kim, San Jose, CA (US); Dafna Beery, Palo Alto, CA (US); Gian Sharma, Fremont, CA (US); Amitay Levi, Cupertino, CA (US); Andrew J. Walker, Mountain View, CA (US)

(73) Assignee: Spin Transfer Technologies, Inc., Fremont, CA (US)

( * ) Notice: Subject to any disclaimer, the term of this patent is extended or adjusted under 35 U.S.C. 154(b) by 0 days.

(21) Appl. No.: 15/865,109

(22) Filed: Jan. 8, 2018

(51) Int. Cl.
 *H01L 27/22* (2006.01)
 *H01L 29/66* (2006.01)
 (Continued)

(52) U.S. Cl.
 CPC ...... *H01L 27/228* (2013.01); *H01L 29/66666* (2013.01); *H01L 29/7827* (2013.01); *H01L 43/08* (2013.01); *H01L 43/12* (2013.01); *H01L 29/42392* (2013.01); *H01L 29/45* (2013.01); *H01L 29/495* (2013.01);
 (Continued)

(58) Field of Classification Search
 CPC .......... H01L 29/78642; H01L 29/7831; H01L 29/42392; H01L 29/66666; H01L 29/7828; H01L 29/66272; H01L 29/66333; H01L 29/66712; H01L 29/66909; H01L 29/732; H01L 29/7371; H01L 29/7327; H01L 27/22; H01L 43/08
 See application file for complete search history.

(56) References Cited

U.S. PATENT DOCUMENTS

| | | |
|---|---|---|
| 5,084,417 A | 1/1992 | Joshi et al. |
| 5,173,327 A | 12/1992 | Sandhu et al. |
| (Continued) | | |

OTHER PUBLICATIONS

Song et al., "A 31ns Random Cycle VCAT-based 4F2 DRAM with Enhanced Cell Efficiency," Symposium on VLSI Circuits Digest of Technical Papers, 2009, pp. 132-133.

(Continued)

*Primary Examiner* — Mohsen Ahmadi
(74) *Attorney, Agent, or Firm* — Zilka-Kotab, P.C.

(57) ABSTRACT

In one embodiment, an apparatus includes lower electrodes positioned below a surface of a substrate, the substrate including crystalline Si, a plurality of strap regions positioned above the lower electrodes and below sets of pillars of Si, the pillars rising above the substrate, the sets of pillars being aligned in a first direction along a plane perpendicular to a film thickness direction, and the strap regions extending above a surface of the substrate, silicide junctions positioned between each of the strap regions and a corresponding lower electrode positioned therebelow, upper electrodes positioned above each of the pillars, gate dielectric layers positioned on sides of the pillars to a height greater than a lower edge of the upper electrodes, and gate layers positioned on sides of the gate dielectric layers in a second direction along the plane and perpendicular to the first direction that transverse a plurality of sets of pillars.

14 Claims, 18 Drawing Sheets

(51) Int. Cl.
*H01L 29/78* (2006.01)
*H01L 29/423* (2006.01)
*H01L 29/786* (2006.01)
*H01L 29/49* (2006.01)
*H01L 43/08* (2006.01)
*H01L 43/12* (2006.01)
*H01L 29/45* (2006.01)
*H01L 29/51* (2006.01)

(52) U.S. Cl.
CPC ...... *H01L 29/4916* (2013.01); *H01L 29/4966* (2013.01); *H01L 29/51* (2013.01); *H01L 29/517* (2013.01); *H01L 29/518* (2013.01); *H01L 29/7831* (2013.01); *H01L 29/78642* (2013.01)

(56) References Cited

U.S. PATENT DOCUMENTS

| | | | |
|---|---|---|---|
| 5,807,788 A | 9/1998 | Brodsky et al. | |
| 6,137,122 A * | 10/2000 | Liaw | H01L 29/7455 257/132 |
| 9,203,015 B2 * | 12/2015 | Aikawa | H01L 43/08 |
| 2007/0285974 A1 * | 12/2007 | Takemura | G11C 8/08 365/158 |
| 2009/0256220 A1 * | 10/2009 | Horng | H01L 43/08 257/421 |
| 2010/0080048 A1 * | 4/2010 | Liu | G11C 11/16 365/157 |
| 2010/0110783 A1 * | 5/2010 | Liu | B82Y 25/00 365/171 |
| 2014/0087534 A1 * | 3/2014 | Choe | G11C 16/0483 438/270 |
| 2016/0172585 A1 * | 6/2016 | Guo | H01L 29/82 438/3 |
| 2016/0268500 A1 * | 9/2016 | Furuhashi | H01L 27/228 |
| 2017/0169872 A1 * | 6/2017 | Yoda | G11C 11/1675 |
| 2017/0279043 A1 * | 9/2017 | Apodaca | H01L 45/1206 |
| 2018/0182956 A1 * | 6/2018 | Ha | H01L 43/12 |
| 2018/0226452 A1 * | 8/2018 | Nam | H01L 27/228 |

OTHER PUBLICATIONS

Hung et al., "Novel 4F2 DRAM Cell with Vertical Pillar Transistor(VPT)," IEEE, 2011, pp. 211-214.

Kotani et al., "A Highly Reliable Selective CVD-W Utilizing SiH4 Reduction for VLSI Contacts," IEEE, 1987, pp. 4 pages.

Ohba et al., "Selective CVD Tungsten Silicide for VLSI Applications," IEEE, 1987, 4 pages.

Rosier et al., "Tungsten chemical vapor deposition characteristics using SiH4 in a single wafer system," Journal of Vacuum Science & Technology B, vol. 6, Nov./Dec. 1988, pp. 1721-1727.

Han et al., "Monolithic Integration of NEMS-CMOS with a Fin Flip-flop Actuated Channel Transistor (FinFACT)," IEEE, 2009, pp. 27.2.1-27.2.4.

Han et al., "FinFACT-Fin Flip-Flop Actuated Channel Transistor," IEEE Electron Device Letters, vol. 31, No. 7, Jul. 2010, pp. 764-766.

* cited by examiner

BURIED TAP FOR A VERTICAL TRANSISTOR USED WITH A PERPENDICULAR MAGNETIC TUNNEL JUNCTION (PMTJ)

FIELD OF THE INVENTION

The present invention relates to magnetic random access memory (MRAM), and more particularly to providing a buried tap for a vertical transistor used with a perpendicular magnetic tunnel junction (pMTJ).

BACKGROUND

Magnetic Random Access Memory (MRAM) is a non-volatile data memory technology that stores data using magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the free magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free layer and the reference layer are oriented in the same direction, the spin of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

SUMMARY

According to one embodiment, a method includes forming a first masking material above a substrate in a film thickness direction, the substrate comprising crystalline Si, removing portions of the first masking material according to a first pattern to form a first mask that includes a plurality of dots of the first masking material, removing first portions of the substrate using the first mask to form a plurality of pillars that include material of the substrate, removing second portions of the substrate to form a plurality of strap regions, the strap regions being formed of substrate material and positioned below sets of pillars aligned in a first direction along a plane perpendicular to the film thickness direction, the strap regions extending above a surface of the substrate in the film thickness direction, forming a spacer layer on sides of the first mask, the pillars, and the strap regions, where the spacer layer is not positioned above the strap regions, forming a second masking material above the strap regions in the film thickness direction and above third portions of the substrate in the film thickness direction to form a second mask, the third portions of the substrate being positioned between the sets of pillars, removing fourth portions of the substrate using the second mask to create voids beneath each of the sets of pillars, forming an electrode material within the voids above the substrate and below the strap regions in the film thickness direction, removing portions of the electrode material between the sets of pillars using the spacer layer as a mask to form electrodes that are positioned beneath the strap regions, forming a silicide junction between each of the strap regions and a corresponding electrode positioned therebelow, forming a first insulative layer above the substrate to a height that coincides with a thickness of the strap regions in the film thickness direction, forming a gate dielectric layer above the first insulative layer and on sides of the pillars to a height greater than a lower edge of the first mask in the film thickness direction, forming a gate layer on the gate dielectric layer, and removing portions of the gate layer in a second direction along the plane and perpendicular to the first direction to form gate electrodes that transverse a plurality of sets of pillars.

In another embodiment, a method includes forming and patterning upper electrodes above a substrate in a film thickness direction, the substrate including crystalline Si, removing portions of the substrate using the upper electrodes as a first mask to form a plurality of pillars that comprise Si and a plurality of strap regions positioned below sets of pillars aligned in a first direction along a plane perpendicular to the film thickness direction, the strap regions extending above a surface of the substrate in the film thickness direction, forming and patterning lower electrodes directly below the strap regions in the film thickness direction that replace a portion of the substrate positioned where the lower electrodes are formed, forming a silicide junction between each of the strap regions and a corresponding lower electrode positioned therebelow, forming gate dielectric layers on sides of the pillars to a height greater than a lower edge of the upper electrodes in the film thickness direction, and forming gate layers on sides of the gate dielectric layers in a second direction along the plane and perpendicular to the first direction that transverse a plurality of sets of pillars.

In accordance with another embodiment, an apparatus includes lower electrodes positioned below a surface of a substrate in a film thickness direction, the substrate including crystalline Si, a plurality of strap regions positioned above the lower electrodes and below sets of pillars of Si, the pillars rising above the substrate in the film thickness direction, the sets of pillars being aligned in a first direction along a plane perpendicular to the film thickness direction, and the strap regions extending above a surface of the substrate in the film thickness direction, silicide junctions positioned between each of the strap regions and a corresponding lower electrode positioned therebelow, upper electrodes positioned above each of the pillars, gate dielectric layers positioned on sides of the pillars to a height greater than a lower edge of the upper electrodes in the film thickness direction, and gate layers positioned on sides of the gate dielectric layers in a second direction along the plane and perpendicular to the first direction that transverse a plurality of sets of pillars.

These and other features and advantages of the invention will be apparent to one of skill in the art upon reading of the following detailed description of the embodiments in conjunction with the figures. In the figures, like reference numerals used in more than one figure indicate a like element, and may be considered in light of the description of the like element presented in any of the other figures having the like element.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

DETAILED DESCRIPTION

Figure 1:
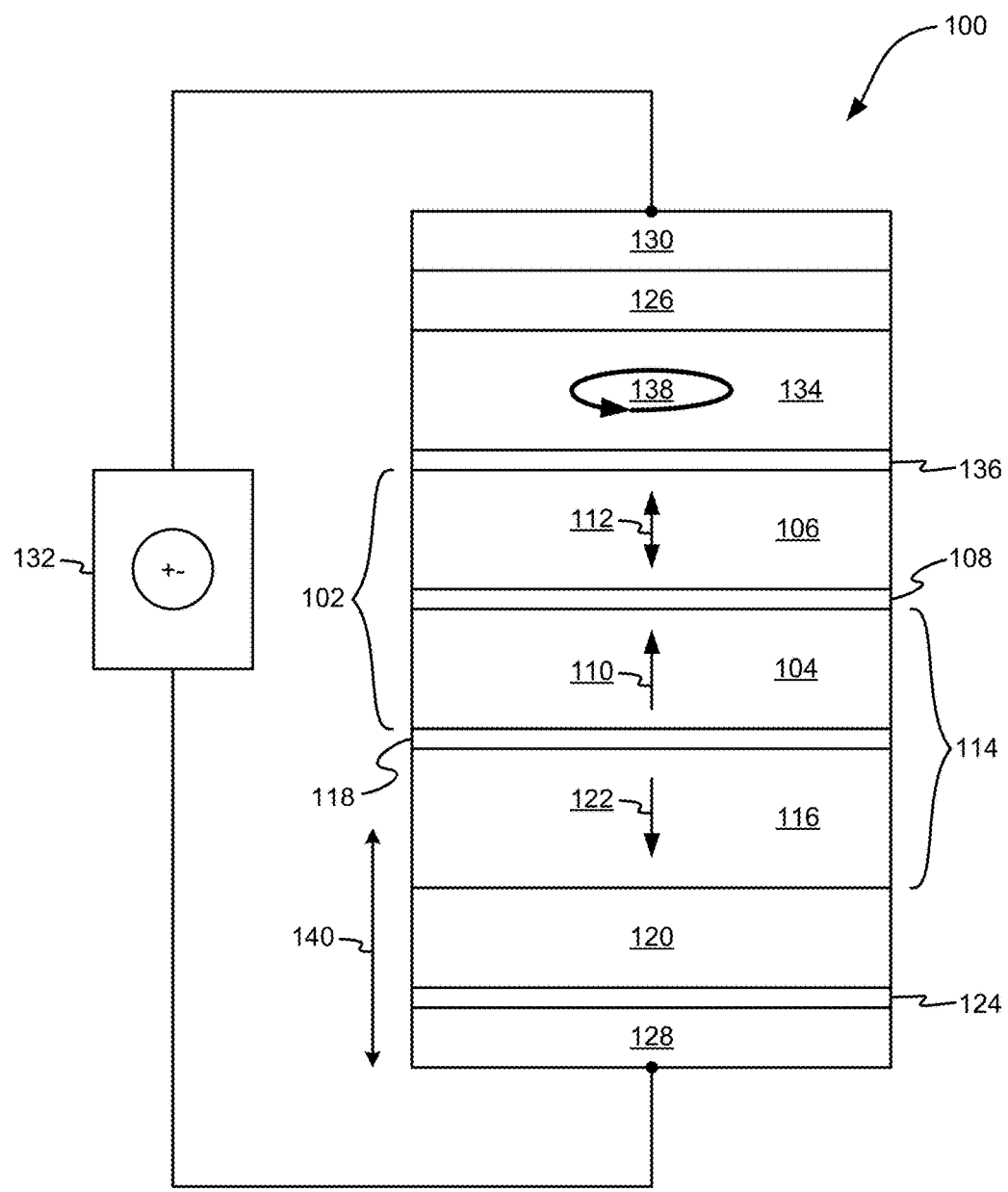
FIG. 1 is a schematic, cross-sectional view of a portion of a magnetic memory element, which may be used in embodiments of the invention.

The following description includes the best embodiments presently contemplated for carrying out the invention. This description is made for the purpose of illustrating the general principles of this invention and is not meant to limit the inventive concepts claimed herein in any way.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an," and "the" include plural referents unless otherwise specified.

Moreover, the term "about" when used herein to modify a value indicates a range that includes the value and less and greater than the value within a reasonable range. In the absence of any other indication, this reasonable range is plus and minus 10% of the value. For example, "about 10 nanometers" indicates 10 nm±1 nm, such that the range includes all values in a range including 9 nm up to and including 11 nm.

Also, the term "comprise" indicates an inclusive list of those elements specifically described without exclusion of any other elements. For example, "a list comprises red and green" indicates that the list includes, but is not limited to, red and green. Therefore, the list may also include other colors not specifically described.

According to one general embodiment, a method includes forming a first masking material above a substrate in a film thickness direction, the substrate comprising crystalline Si, removing portions of the first masking material according to a first pattern to form a first mask that includes a plurality of dots of the first masking material, removing first portions of the substrate using the first mask to form a plurality of pillars that include material of the substrate, removing second portions of the substrate to form a plurality of strap regions, the strap regions being formed of substrate material and positioned below sets of pillars aligned in a first direction along a plane perpendicular to the film thickness direction, the strap regions extending above a surface of the substrate in the film thickness direction, forming a spacer layer on sides of the first mask, the pillars, and the strap regions, where the spacer layer is not positioned above the strap regions, forming a second masking material above the strap regions in the film thickness direction and above third portions of the substrate in the film thickness direction to form a second mask, the third portions of the substrate being positioned between the sets of pillars, removing fourth portions of the substrate using the second mask to create voids beneath each of the sets of pillars, forming an electrode material within the voids above the substrate and below the strap regions in the film thickness direction, removing portions of the electrode material between the sets of pillars using the spacer layer as a mask to form electrodes that are positioned beneath the strap regions, forming a silicide junction between each of the strap regions and a corresponding electrode positioned therebelow, forming a first insulative layer above the substrate to a height that coincides with a thickness of the strap regions in the film thickness direction, forming a gate dielectric layer above the first insulative layer and on sides of the pillars to a height greater than a lower edge of the first mask in the film thickness direction, forming a gate layer on the gate dielectric layer, and removing portions of the gate layer in a second direction along the plane and perpendicular to the first direction to form gate electrodes that transverse a plurality of sets of pillars.

In another general embodiment, a method includes forming and patterning upper electrodes above a substrate in a film thickness direction, the substrate including crystalline Si, removing portions of the substrate using the upper electrodes as a first mask to form a plurality of pillars that comprise Si and a plurality of strap regions positioned below sets of pillars aligned in a first direction along a plane perpendicular to the film thickness direction, the strap regions extending above a surface of the substrate in the film thickness direction, forming and patterning lower electrodes directly below the strap regions in the film thickness direction that replace a portion of the substrate positioned where the lower electrodes are formed, forming a silicide junction between each of the strap regions and a corresponding lower electrode positioned therebelow, forming gate dielectric layers on sides of the pillars to a height greater than a lower edge of the upper electrodes in the film thickness direction, and forming gate layers on sides of the gate dielectric layers in a second direction along the plane and perpendicular to the first direction that transverse a plurality of sets of pillars.

In accordance with another general embodiment, an apparatus includes lower electrodes positioned below a surface of a substrate in a film thickness direction, the substrate including crystalline Si, a plurality of strap regions positioned above the lower electrodes and below sets of pillars of Si, the pillars rising above the substrate in the film thickness direction, the sets of pillars being aligned in a first direction along a plane perpendicular to the film thickness direction, and the strap regions extending above a surface of the substrate in the film thickness direction, silicide junctions positioned between each of the strap regions and a corresponding lower electrode positioned therebelow, upper electrodes positioned above each of the pillars, gate dielectric layers positioned on sides of the pillars to a height greater than a lower edge of the upper electrodes in the film thickness direction, and gate layers positioned on sides of the gate dielectric layers in a second direction along the plane and perpendicular to the first direction that transverse a plurality of sets of pillars.

Referring to FIG. 1, a magnetic memory element 100 is shown according to one embodiment. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating magnetic barrier layer 108 positioned between the reference layer 104 and the free layer 106 in a film thickness direction 140. The barrier layer 108 may include an oxide, such as MgO, $Al_2O_3$, etc., or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows. While the magnetization 112 of the free layer 106 remains in either of two directions perpendicular to the plane of the free layer 106 in a quiescent state, it may be selectable switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic pinned layer 116 and a non-magnetic, antiparallel coupling layer 118 positioned between the pinned layer 116 and the reference layer 104 in the film thickness direction 140. The antiparallel coupling layer 118 may comprise any suitable material known in the art, such as Ru, and may be constructed to have a thickness that causes ferromagnetic antiparallel coupling of the pinned layer 116 and the reference layer 104.

In one approach, the pinned layer 116 may be exchange coupled with an antiferromagnetic layer 120, which may comprise any suitable material known in the art, such as IrMn. Exchange coupling between the antiferromagnetic layer 120 and the pinned layer 116 strongly pins the magnetization 122 of the pinned layer 116 in a first direction. The antiparallel coupling between the pinned layer 116 and the reference layer 104 pins the magnetization 110 of the reference layer 104 in a second direction opposite to the direction of magnetization 122 of the pinned layer 116.

According to one approach, a seed layer 124 may be positioned below the pinned layer 116 in the film thickness direction 140 to initiate a desired crystalline structure in the layers deposited thereabove.

In another approach, a capping layer 126 may be positioned above the free layer 106 to protect the underlying layers during manufacture, such as during high temperature annealing.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Ru, Au, Ag, Cu, etc., and may provide an electrical connection with a circuit 132. The circuit 132 may include a current source, and may further include circuitry for reading an electrical resistance across the memory element 100.

The magnetic free layer 106 has a magnetic anisotropy that causes the magnetization 112 of the free layer 106 to remain stable in one of two directions perpendicular to the horizontal plane of the free layer 106. In a write mode of use for the memory element 100, the orientation of the magnetization 112 of the free layer 106 may be switched between these two directions by applying an electrical current through the memory element 100 via the circuit 132. A current in a first direction causes the magnetization 112 of the free layer 106 of the memory element 100 to flip to a first orientation, and a current in a second direction opposite to the first direction causes the magnetization 112 of the free layer 106 of the memory element 100 to flip to a second, opposite direction.

For example, if the magnetization 112 is initially oriented in an upward direction in FIG. 1, applying a current in a downward direction through the memory element 100 causes electrons to flow in an opposite direction upward through the memory element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions, from the upward direction to a downward direction.

On the other hand, if the magnetization 112 of the free layer 106 is initially in a downward direction in FIG. 1, applying an electrical current through the memory element 100 in an upward direction in FIG. 1 causes electrons to flow in an opposite direction, downward through the memory element 100. However, because the magnetization 112 of the free layer 106 is opposite to the magnetization 110 of the reference layer 104, the electrons will not be able to pass through the barrier layer 108. As a result, the electrons (which have been spin polarized by the magnetization 112 of the free layer 106) will accumulate at the junction between the free layer 106 and the barrier layer 108. This accumulation of spin polarized electrons causes a spin torque that causes the magnetization 112 of the free layer 106 to flip from the downward direction to an upward direction.

In order to assist the switching of the magnetization 112 of the free layer 106, the memory element 100 may include a spin polarization layer 134 positioned above the free layer 106. The spin polarization layer 134 may be separated from the free layer 106 by an exchange coupling layer 136. The spin polarization layer 134 has a magnetic anisotropy that causes it to have a magnetization 138 with a primary component oriented in the in plane direction (e.g., perpendicular to the magnetization 112 of the free layer and the magnetization 110 of the reference layer 104). The magnetization 138 of the spin polarization layer 134 may be fixed in one approach, or may move in a processional manner as shown in FIG. 1. The magnetization 138 of the spin polarization layer 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the memory element 100.

The memory element 100 described in FIG. 1 is intended to provide context to the various embodiments described herein. The structures and methods described herein in accordance with various embodiments may comprise a portion of the memory element 100 described in FIG. 1 and/or used in conjunction with the memory element 100, in various approaches.

Figure 2:
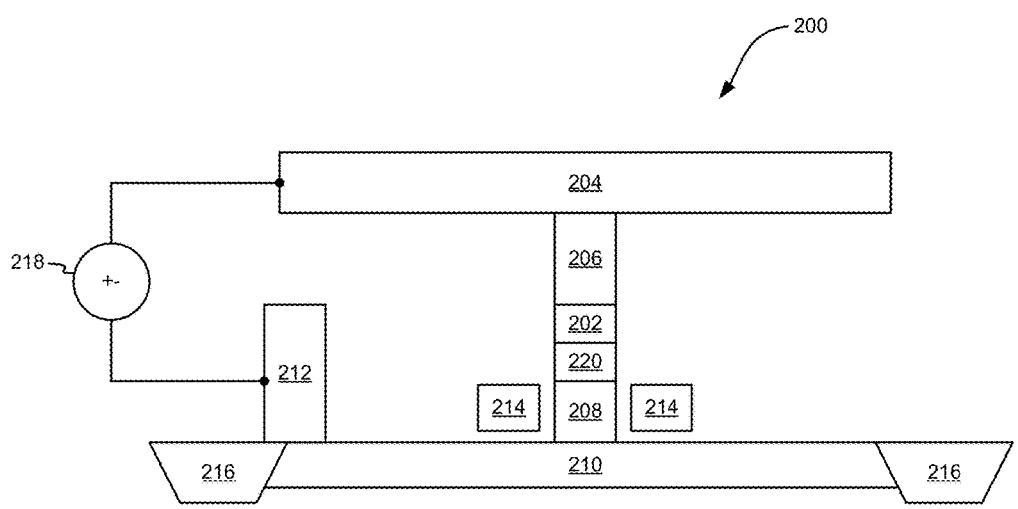
FIG. 2 is a schematic, cross-sectional view of a portion of a magnetic random access memory (MRAM) that includes a magnetoresistive sensor, which may be used in embodiments of the invention.

Now referring to FIG. 2, a portion of a magnetic random access memory (MRAM) structure 200 that includes a magnetoresistive sensor 202 is shown according to one embodiment. The MRAM structure 200 may be operated and utilized as understood by those of skill in the art, with any special use cases being specified in accordance with an embodiment herein. The memory element 100 described in FIG. 1 may be used as the magnetoresistive sensor 202 of FIG. 2 in accordance with embodiments that store data in MRAM. In one embodiment, an MTJ element may be used as the magnetoresistive sensor 202.

The MRAM structure 200 includes a bit line 204 that supplies current across the magnetoresistive sensor 202 from a voltage source 218. The bit line 204 may comprise any suitable material known in the art, such as TaN, W, TiN, Au, Ag, Cu, etc. An extension layer 206 electrically couples the magnetoresistive sensor 202 with the bit line 204. The extension layer 206 may comprise any suitable material known in the art, such as Ru, Ta, etc. A source terminal 220 is coupled between the magnetoresistive sensor 202 and a channel layer 208, which is in electrical contact with a n+ source layer 210. The channel layer 208 may comprise any suitable semiconductor material known in the art, such as Si, Ge, GaAs-compounds, etc. The n+ source layer 210 may comprise any suitable material known in the art, such as TaN, W, TiN, Au. Ag, Cu, etc., and is electrically coupled to the voltage source 218 via a source line 212, which may comprise any suitable material known in the art, such as TaN, W, TiN, Au, Ag, Cu, etc. Positioned across the channel layer 208 is a word line 214 which may comprise any suitable material known in the art, such as TaN, W, TiN, Au, Ag, Cu, etc. On either side of the n+ source layer 210 are shallow trench isolation (STI) layers 216 which provide electrical insulation between an adjacent n+ source layer 210. Moreover, although not specifically shown, electrically insulative material may be positioned around the various layers shown in FIG. 2, as would be understood by one of skill in the art.

Silicon channels that are used to connect conventional MTJs show low field effect mobility compared to III-V semiconductor channels which are constructed of materials such as InGaAs, InAs, etc. The current used during operation of a pMTJ is greater than that used by a typical MTJ during operation. Therefore, a silicon channel semiconductor, which is typically used to deliver voltage to a MTJ is not able to handle the current load of a pMTJ during write operation, e.g., 6-10 mega-ampere per square centimeter ($MA/cm^2$), when a silicon channel is configured to have a minimum size allowed in certain complementary metal-oxide-semiconductor (CMOS) technologies. Therefore, it is desirable to utilize a compound semiconductor channel as an access transistor for a pMTJ memory array. Methods of manufacturing such a compound semiconductor channel (vertical III-V semiconductor channel for use with a pMTJ) are described herein in accordance with several embodiments, along with the structures themselves.

Now referring to FIGS. 3A-3O, formation of a structure which includes a buried tap for a subsequently formed vertical transistor (e.g., a pMTJ) is shown according to one embodiment. The buried tap structure may be formed in accordance with the present invention in any of the environments depicted herein, among others not specifically described, in various approaches. Of course, more steps, layers, and/or structures may be utilized in the formation of any of the structures and/or layers thereof than those specifically described in FIGS. 3A-3O, as would be understood by one of skill in the art upon reading the present descriptions.

Figure 3A:
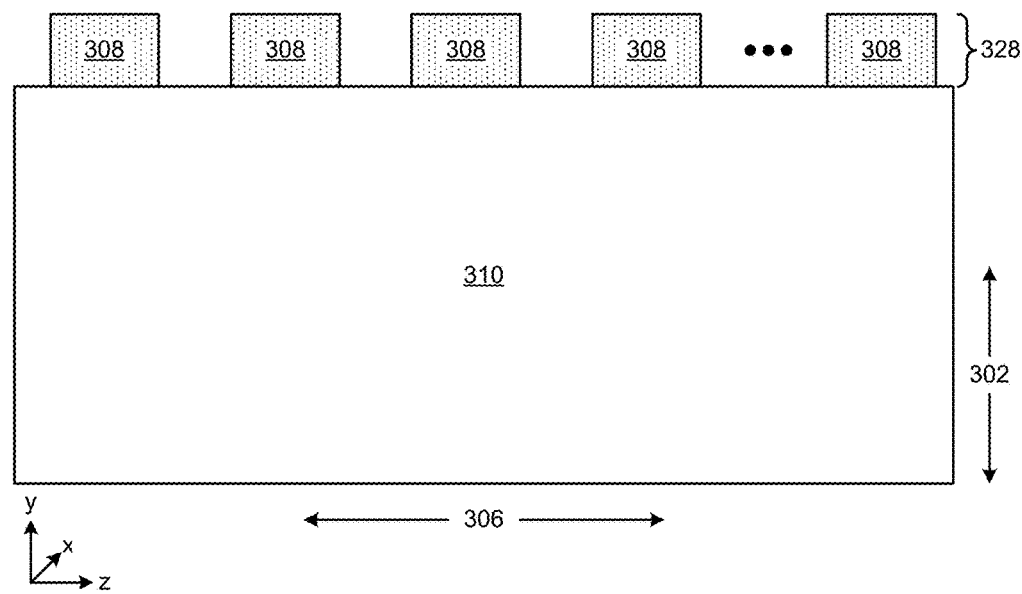
FIGS. 3A-3O show various structures created during manufacture of a structure which includes a buried tap according to one embodiment.
Figure 3A:
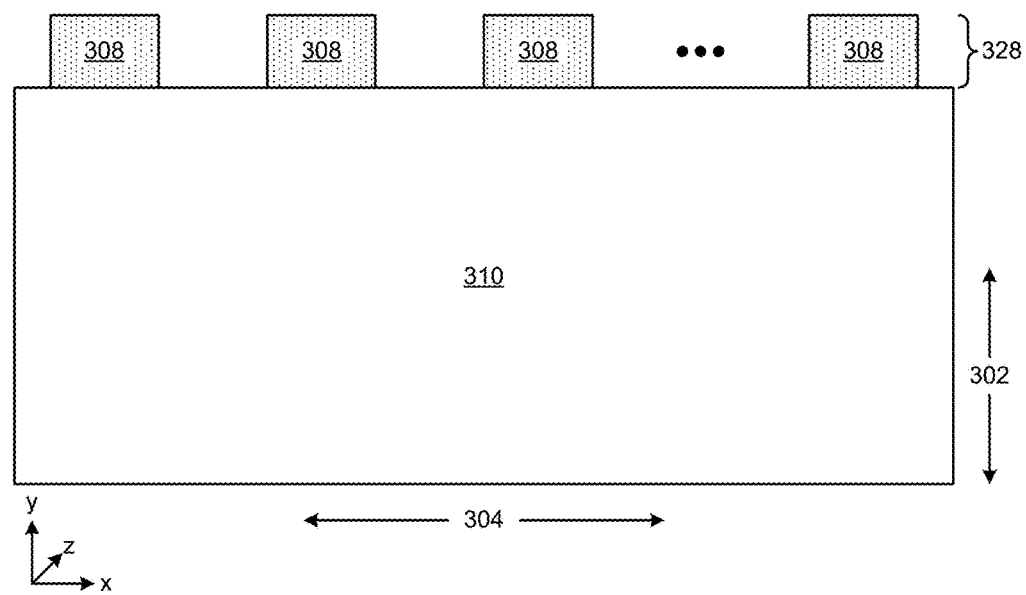
Figure 3B:
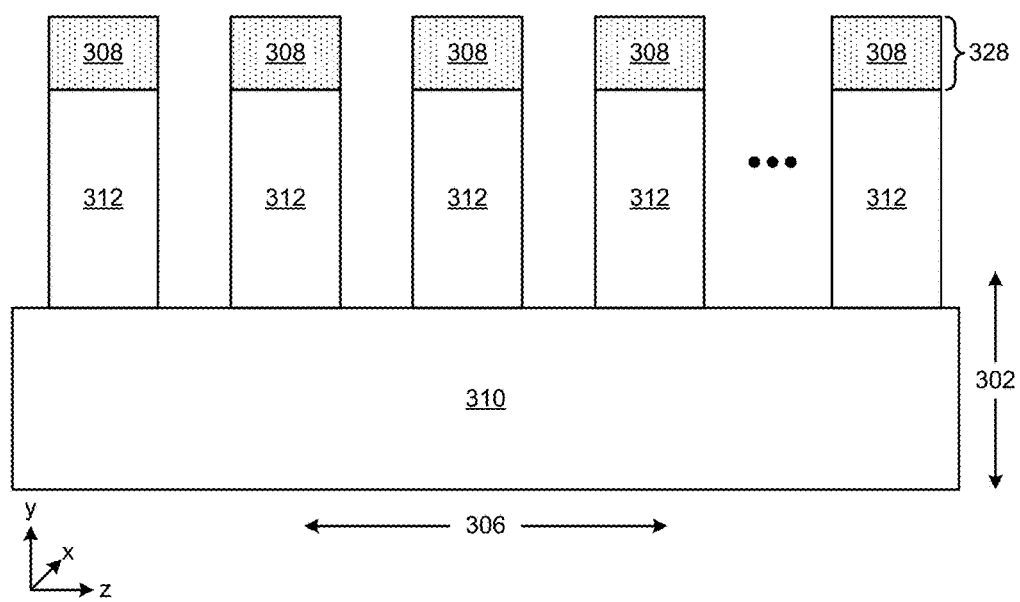
Figure 3B:
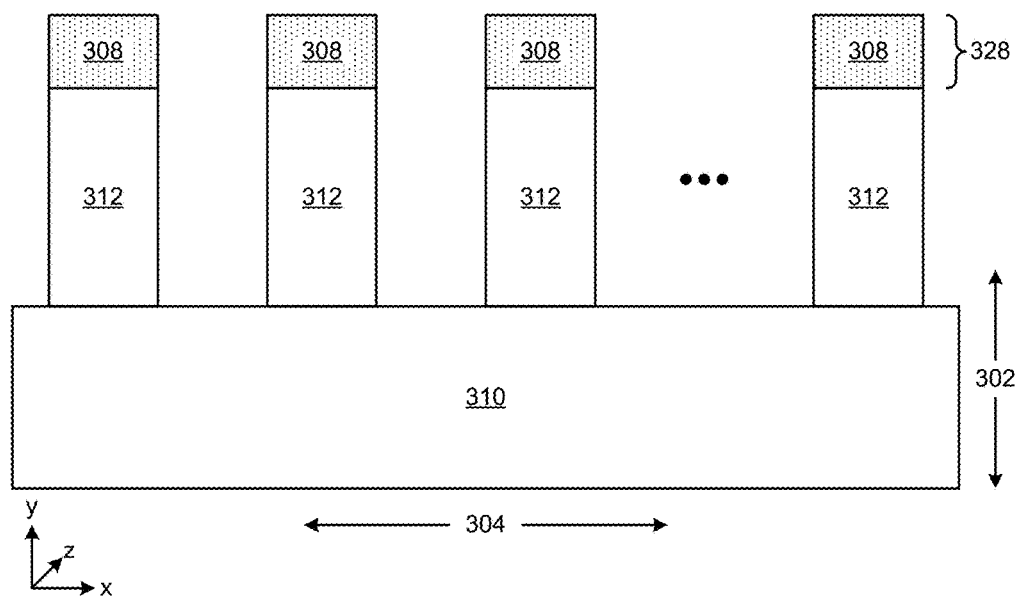
Figure 3C:
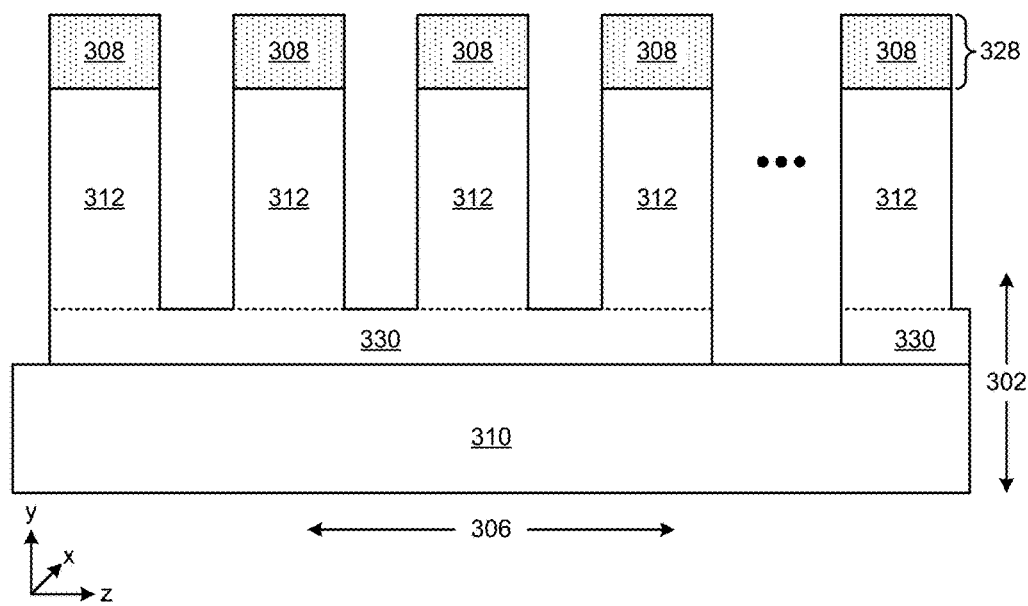
Figure 3C:
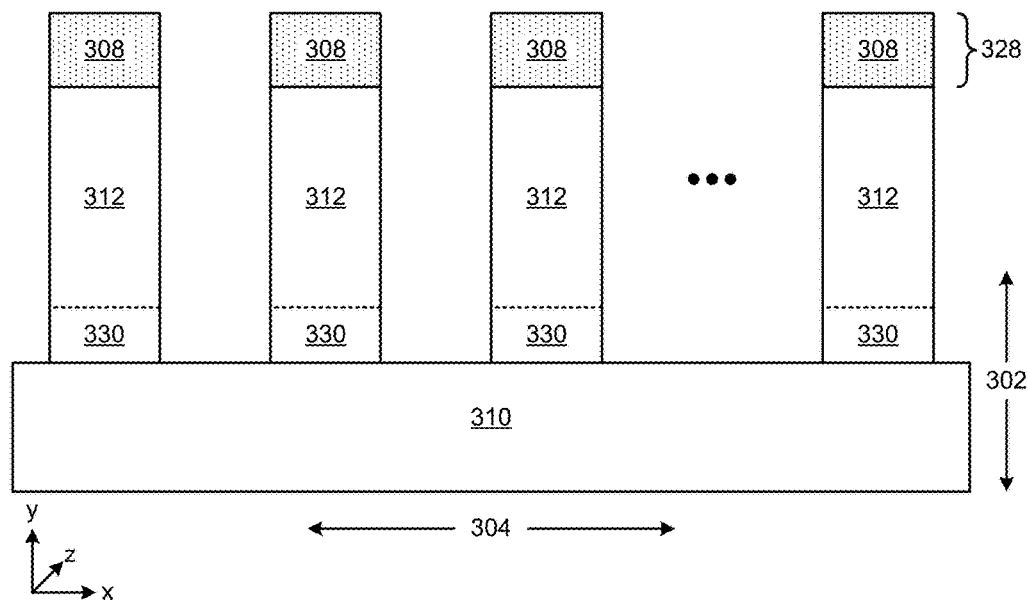
Figure 3D:
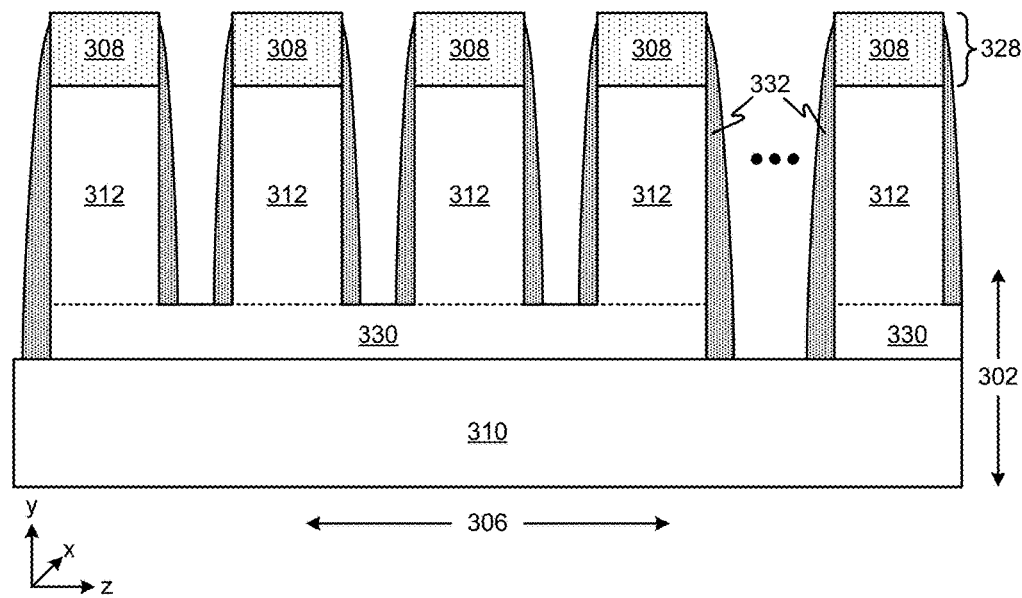
Figure 3D:
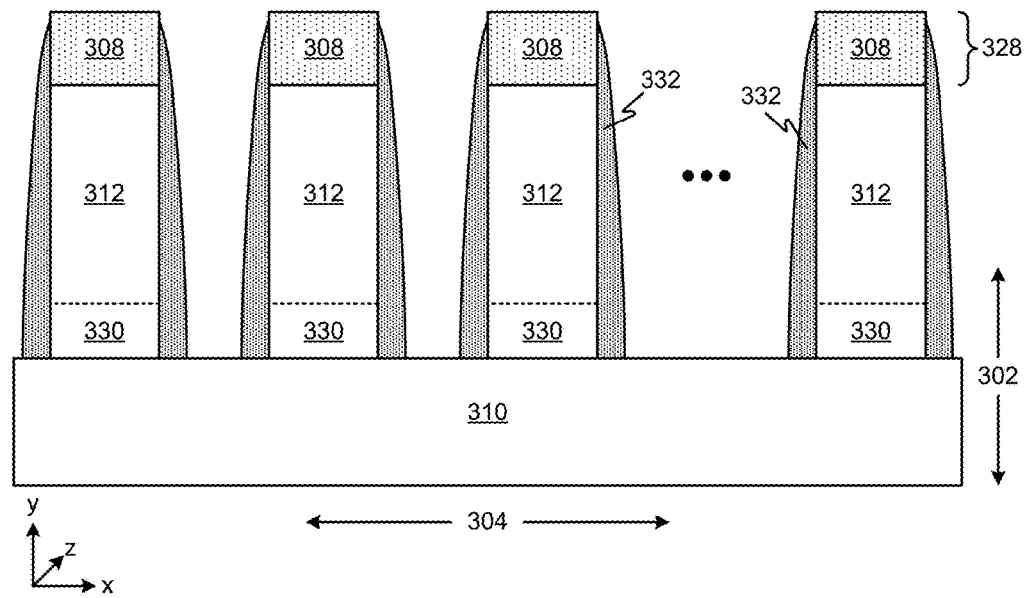
Figure 3E:
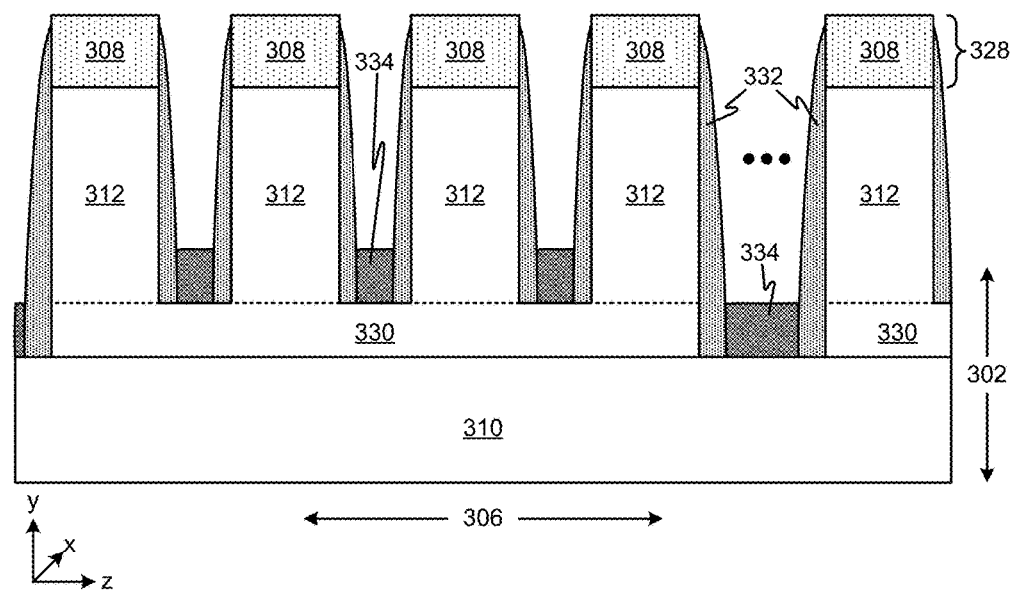
Figure 3E:
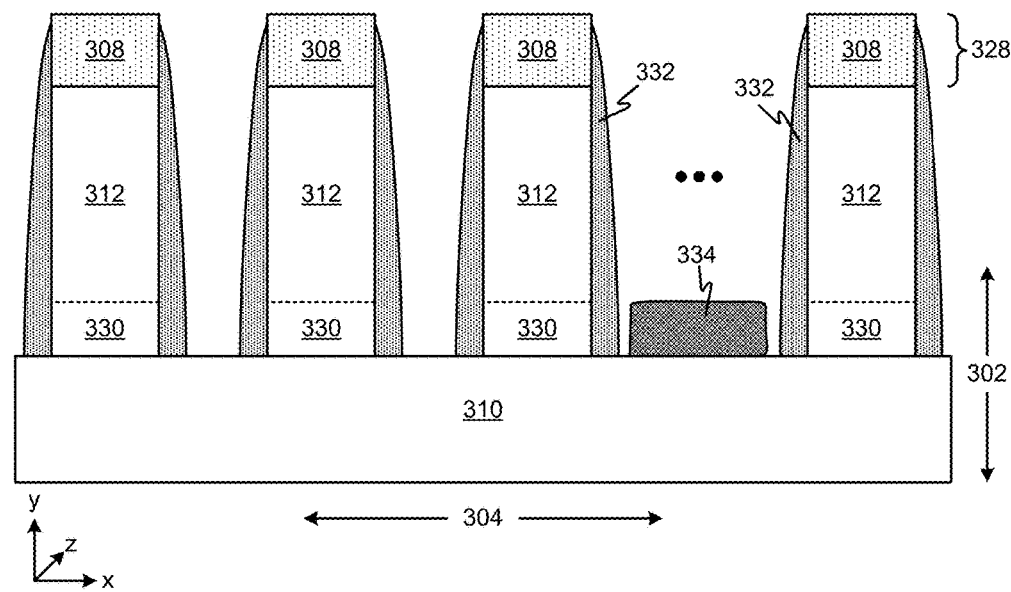
Figure 3F:
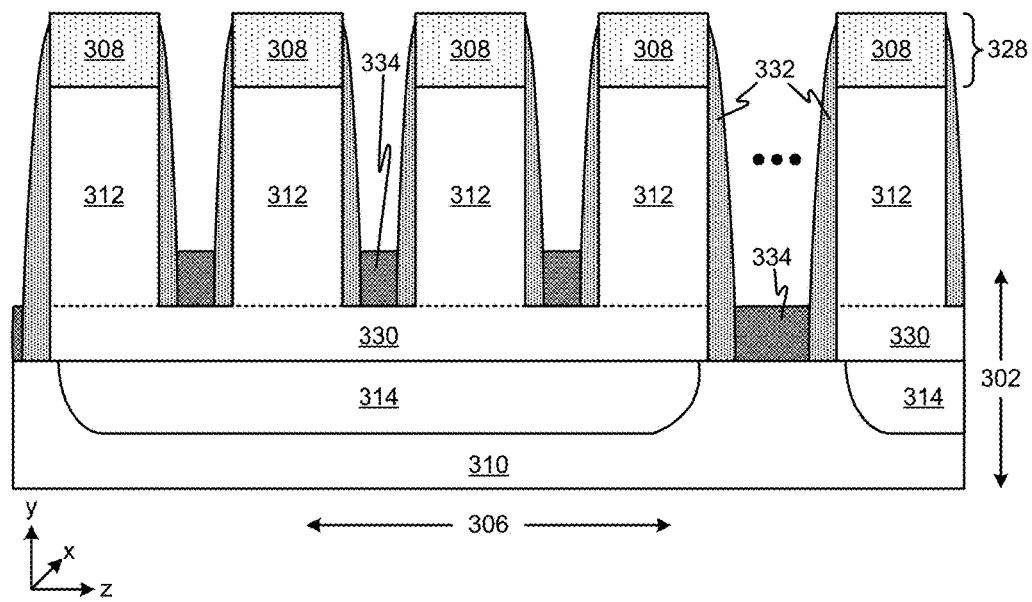
Figure 3F:
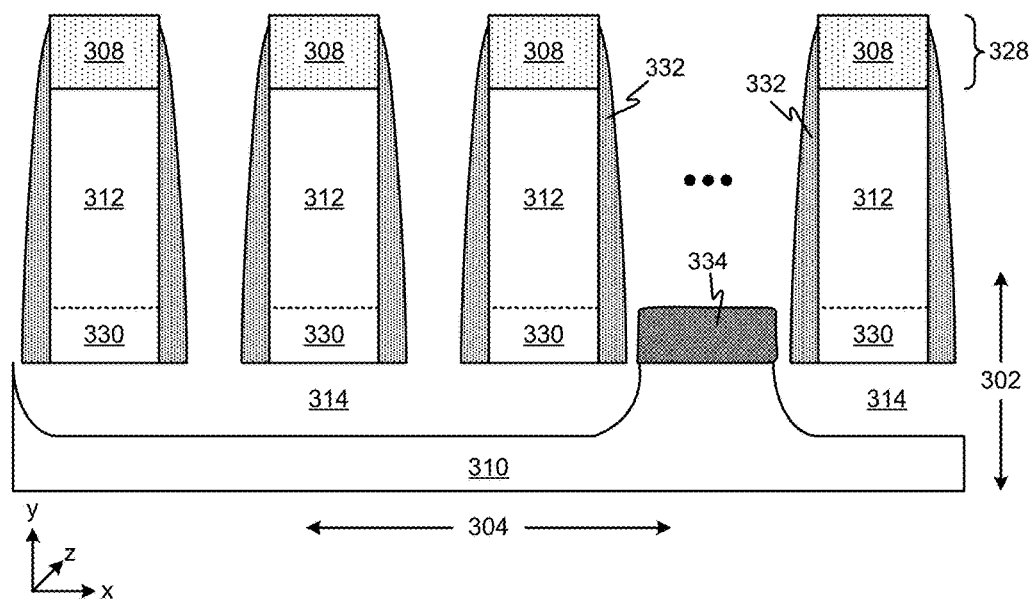
Figure 3G:
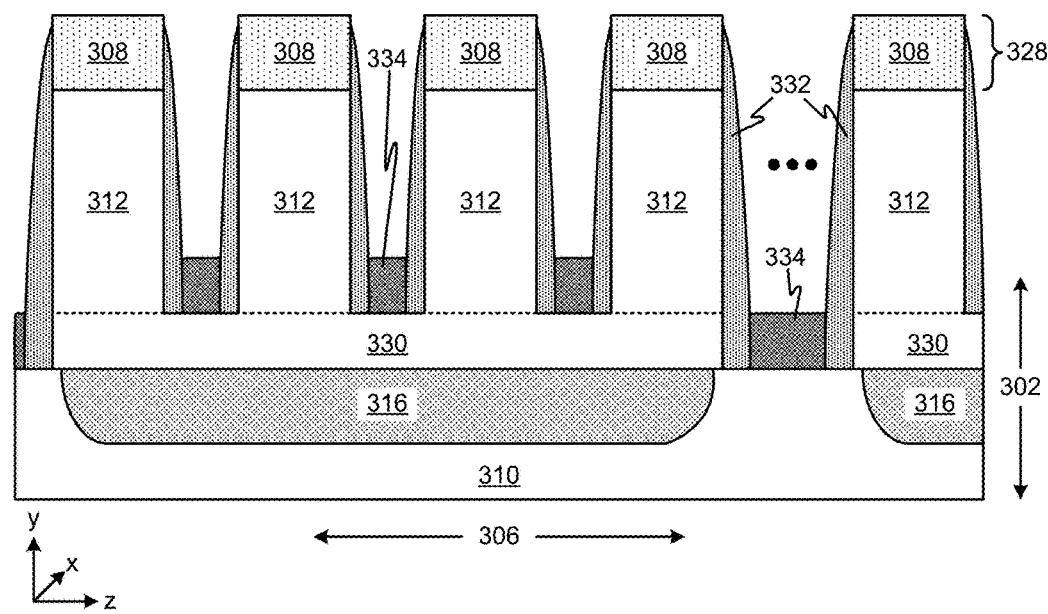
Figure 3G:
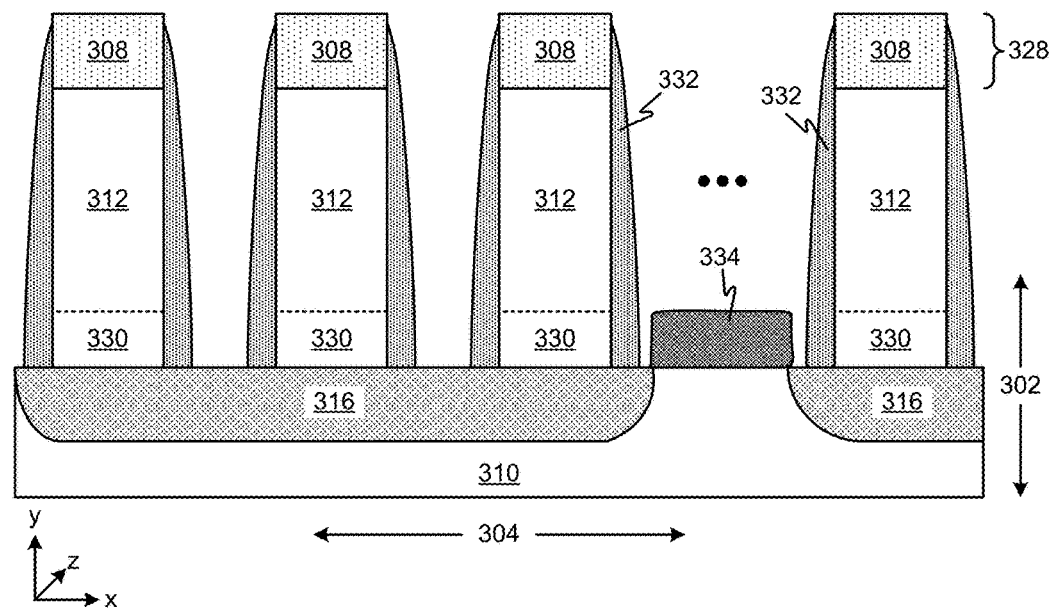
Figure 3H:
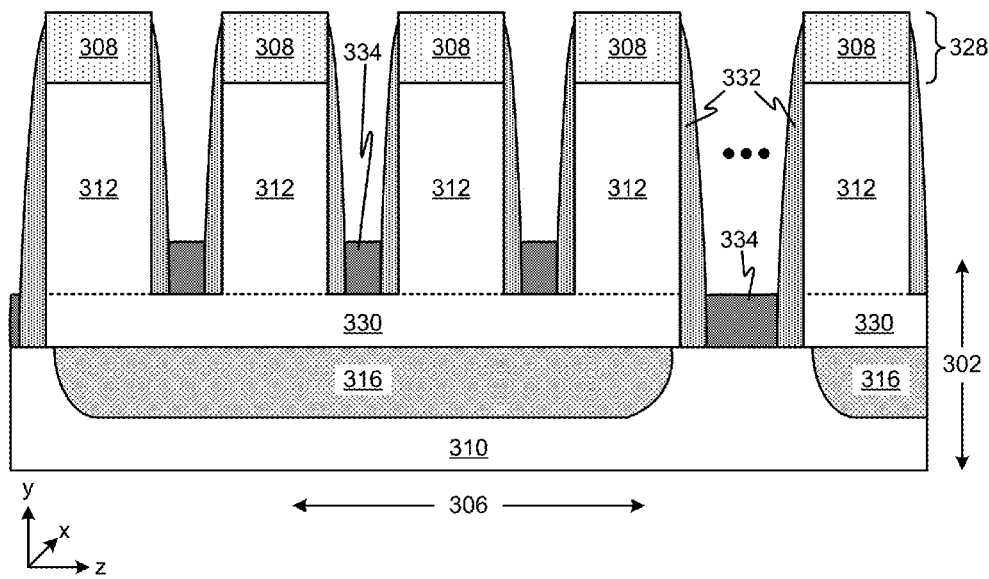
Figure 3H:
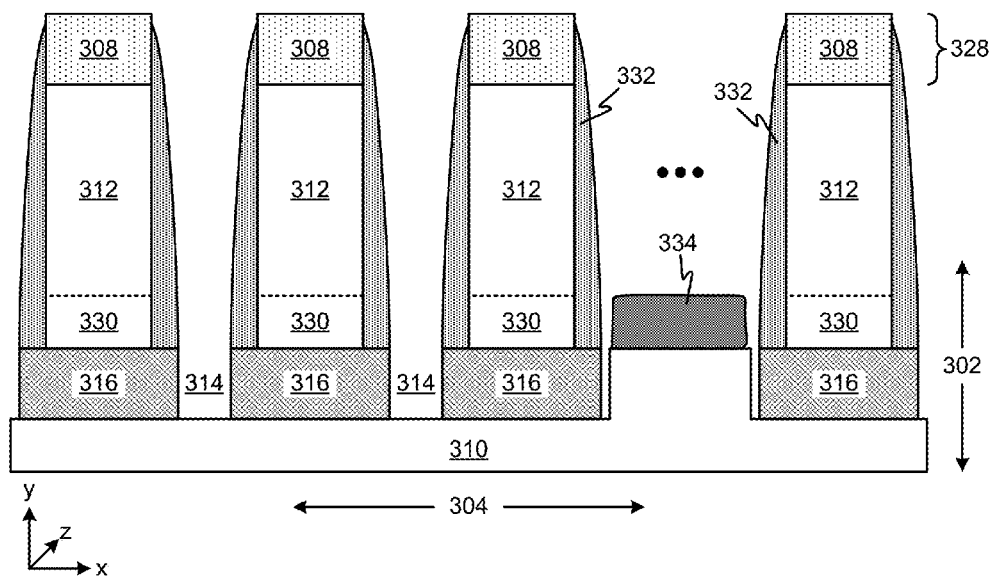
Figure 3I:
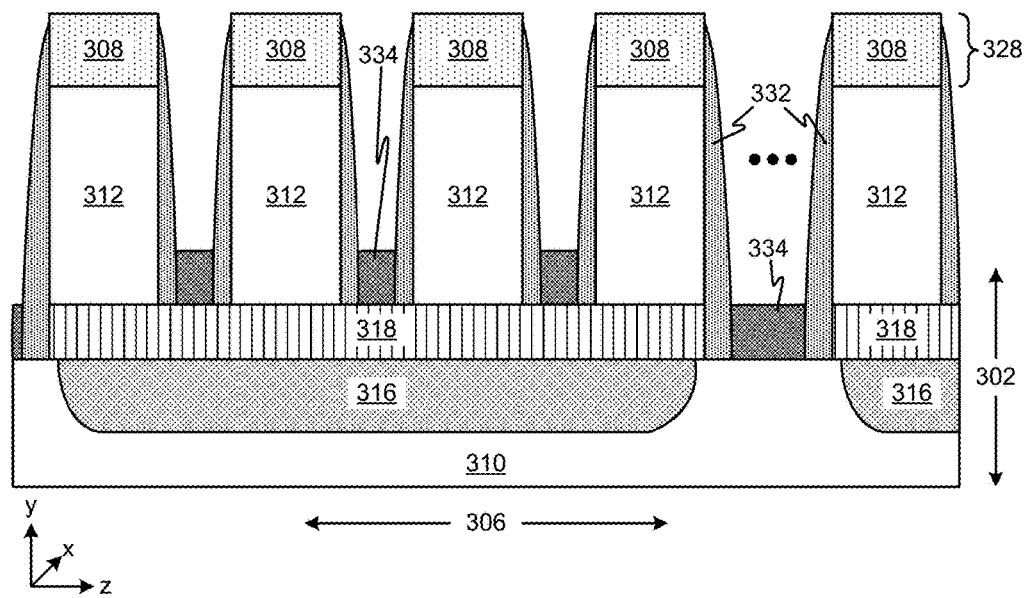
Figure 3I:
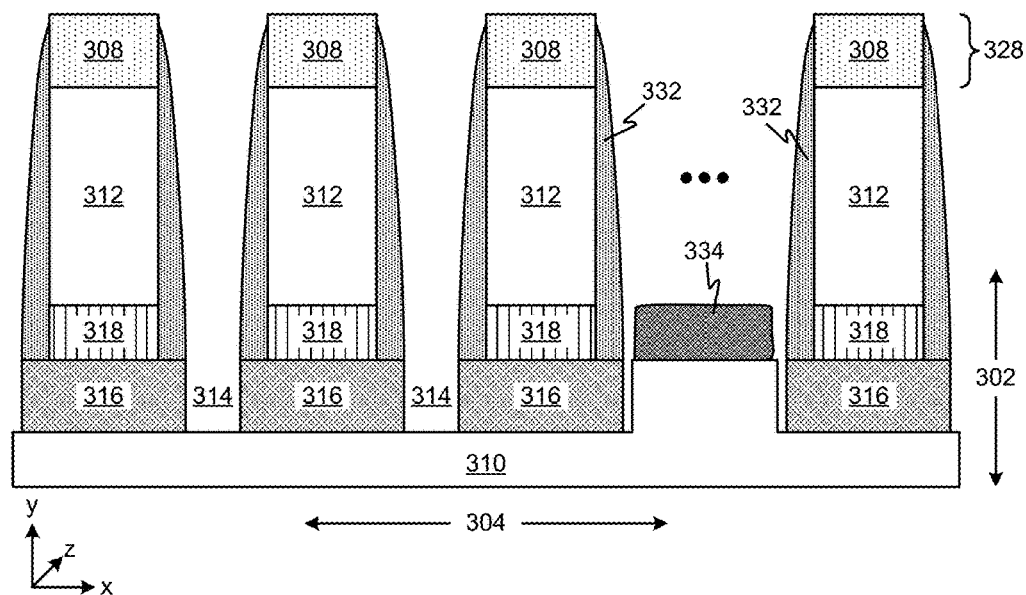
Figure 3J:
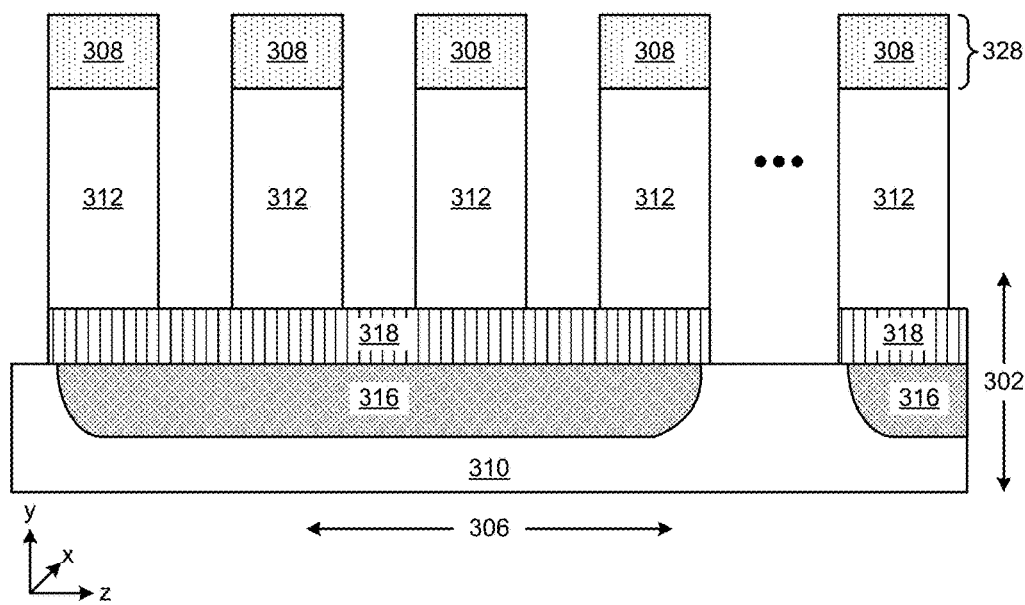
Figure 3J:
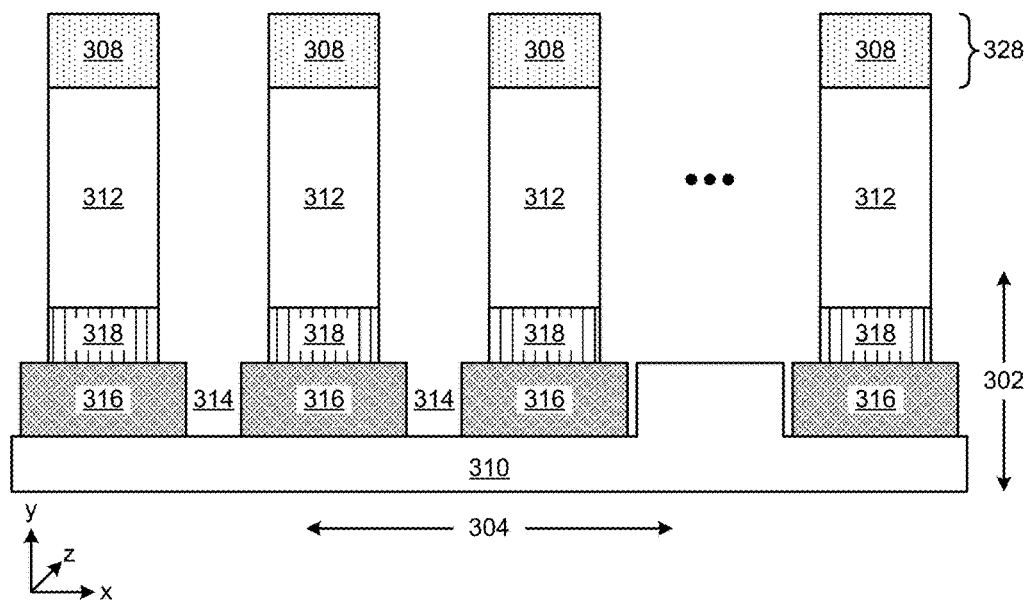
Figure 3K:
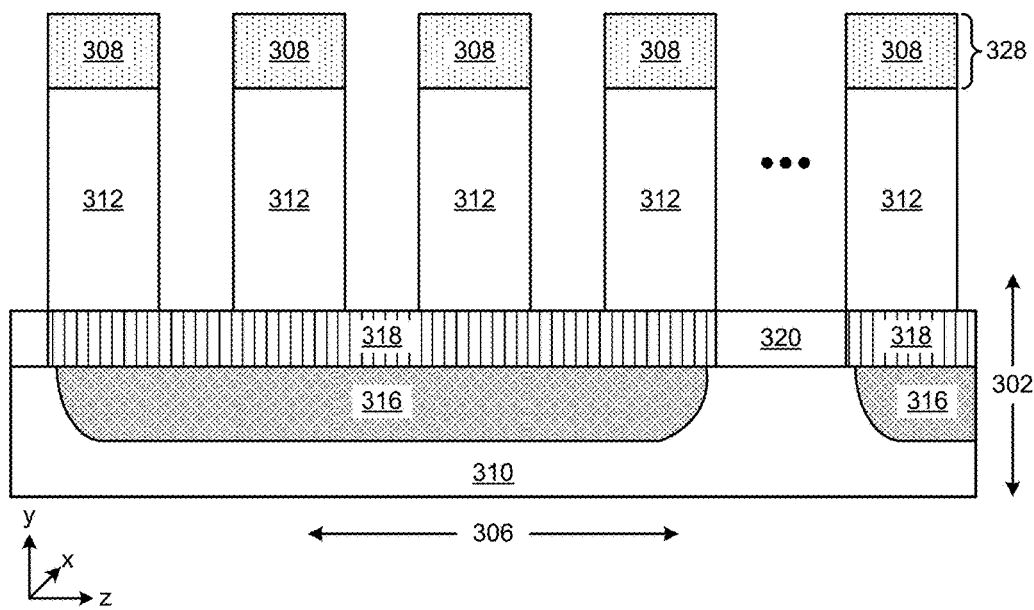
Figure 3K:
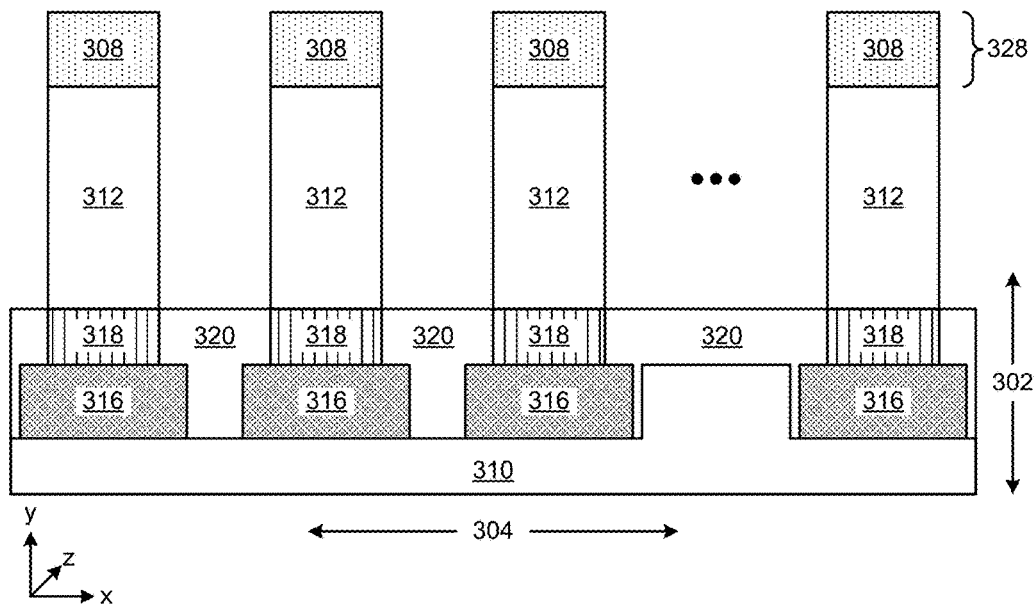
Figure 3L:
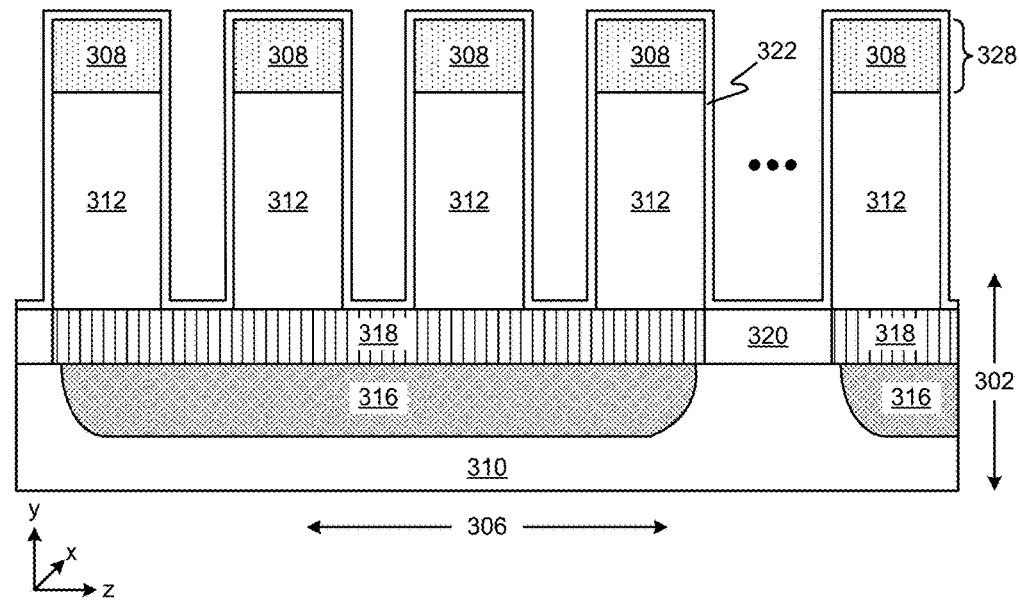
Figure 3L:
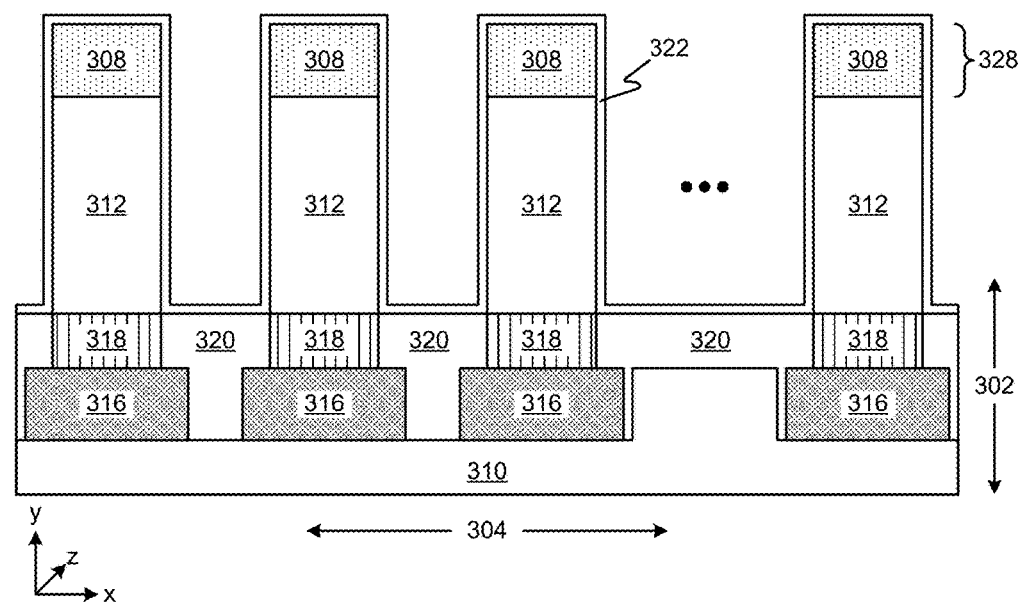
Figure 3M:
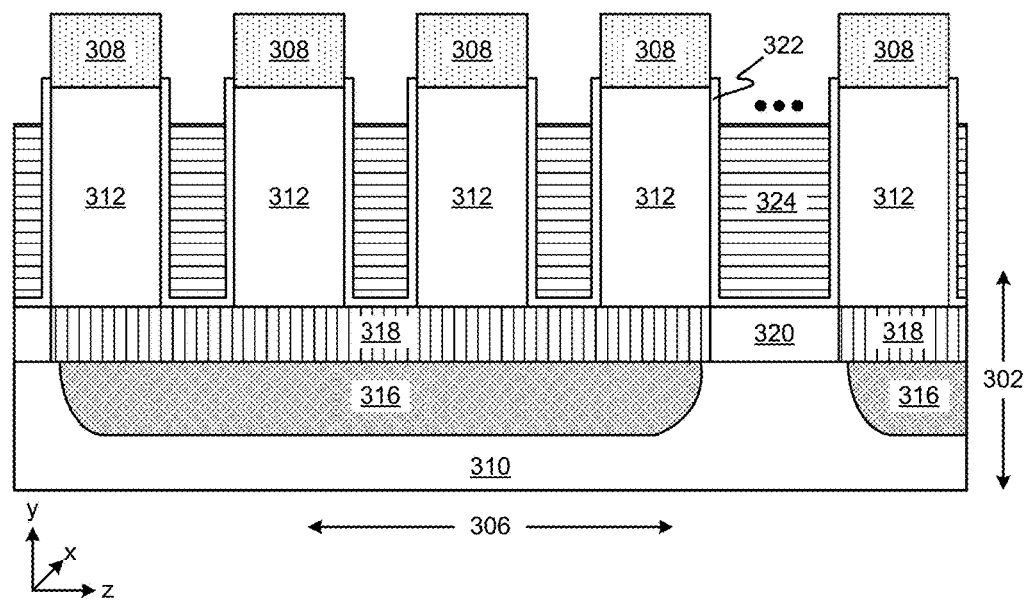
Figure 3M:
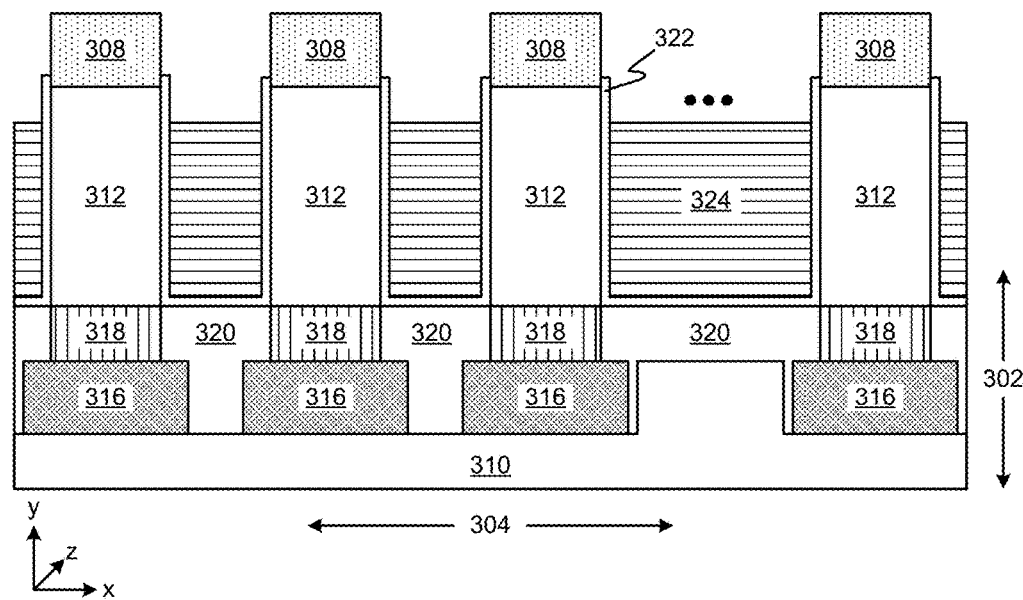
Figure 3N:
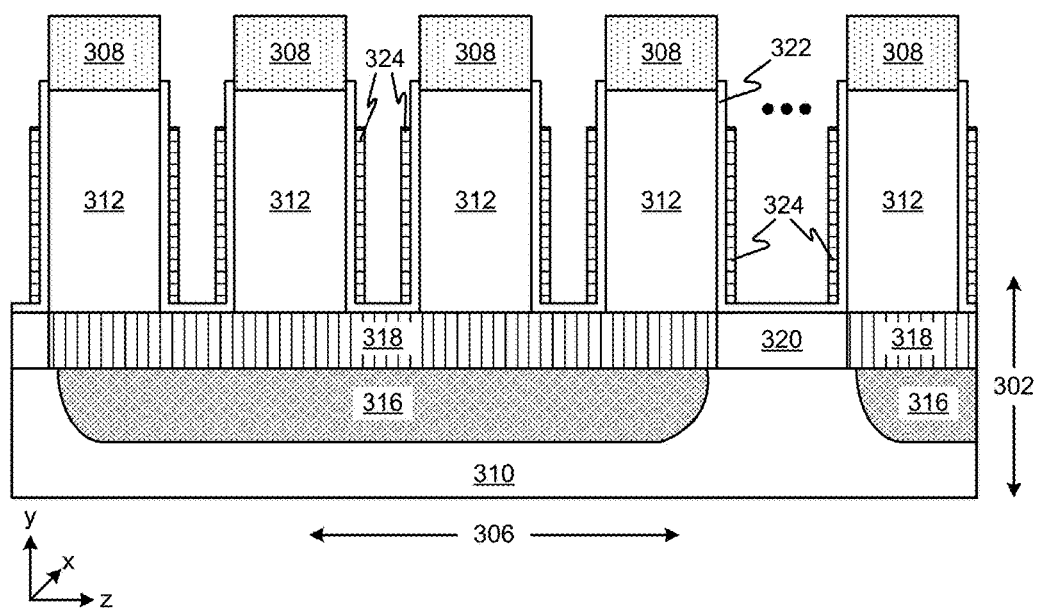
Figure 3N:
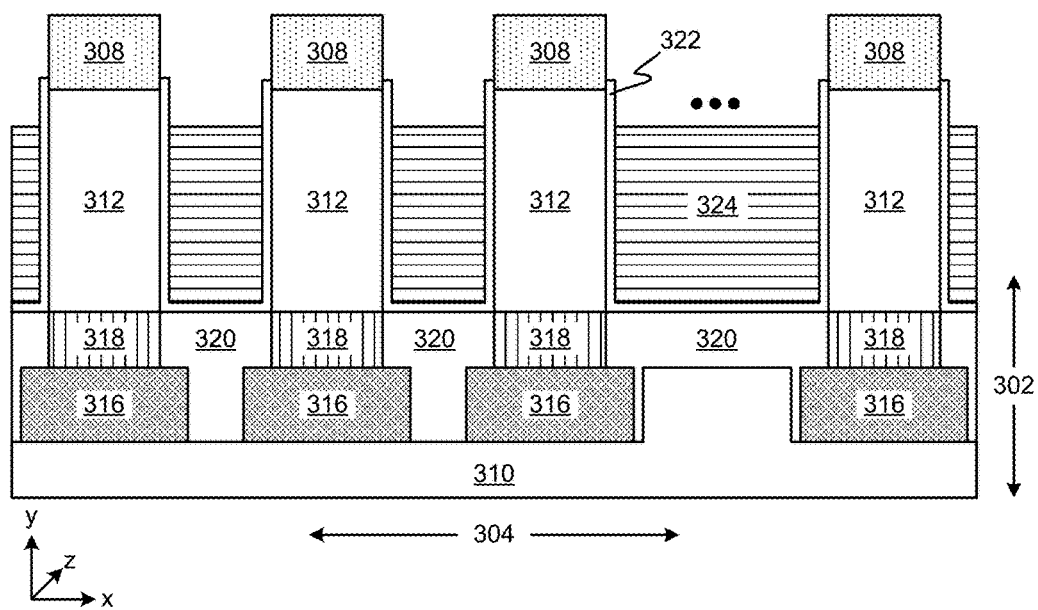
Figure 3O:
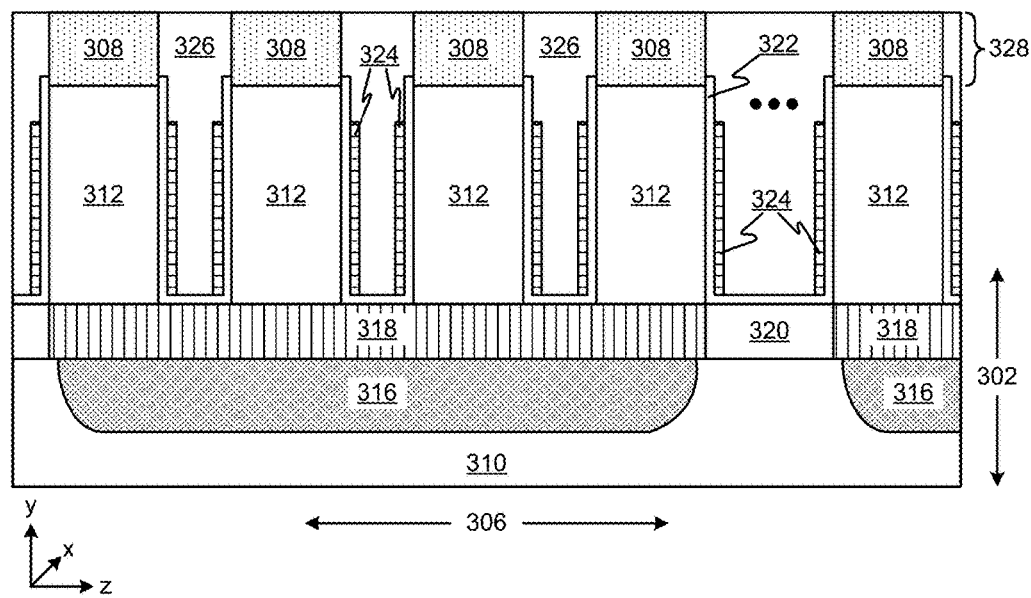
Figure 3O:
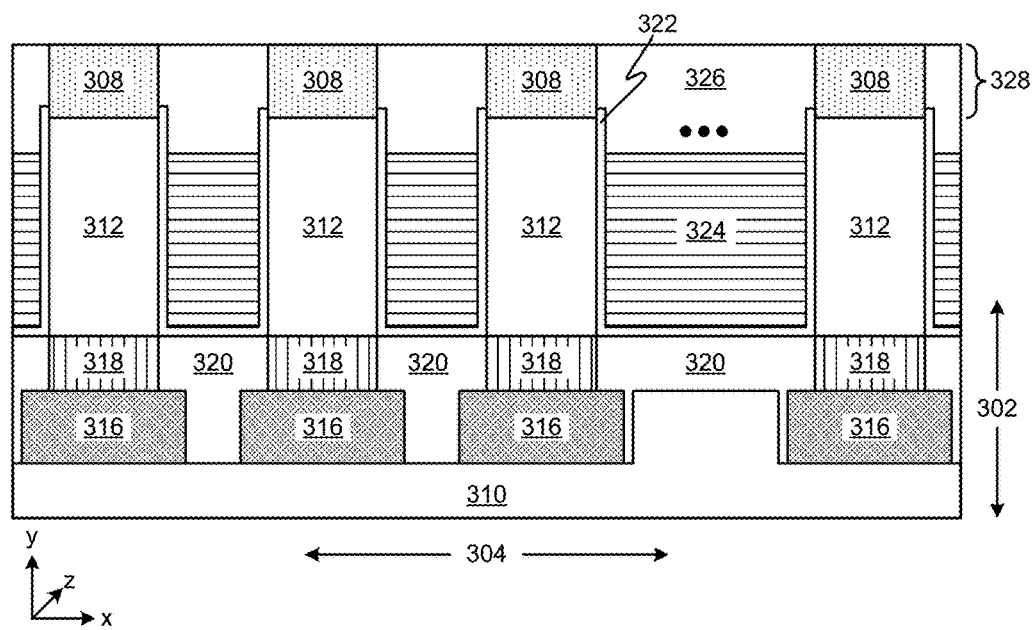

In FIGS. 3A-3O, two views are shown of each intermediate structure, the view on the bottom shows an x-y plane cross-section of the various structures, with the x-direction being an element width direction 304 and the y-direction being a film thickness direction 302. The view on the top of each figure shows a y-z plane cross-section of the various structures, with the z-direction being an element depth direction 306 and the y-direction still being the film thickness direction 302.

Each of the intermediate structures shown in FIGS. 3A-3O may be formed by any suitable component of the operating environment. For example, in various embodiments, the structure(s) may be partially or entirely formed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to form one or more structures or layer thereof. Illustrative processing circuits include, but are not limited to, a CPU, an ASIC, a FPGA, etc., combinations thereof, or any other suitable computing device known in the art.

In the descriptions of FIGS. 3A-3O, each layer may be formed using any known deposition process, such as sputtering, plating, chemical vapor deposition (CVD), plasma chemical vapor deposition (pCVD), physical vapor deposition (PVD), molecular beam epitaxy (MBE), atomic layer deposition (ALD), etc. Moreover, any descriptions of removal of layers and/or material may be performed using any material removal process of a type known in the art, such as planarization, chemical mechanical polishing (CMP), recess etching, reactive ion etching (RIE), ion milling, plasma etching, photolithography, etc.

As shown in FIG. 3A, a first masking material 308 is formed above a substrate 310 in a film thickness direction 302. Thereafter, portions of the first masking material 308 are removed according to a first pattern to form a first mask 328 that comprises a plurality of dots of the first masking material 308 arranged in a desired pattern (spacing between the dots in the element width direction 304 and the element depth direction 306 are controlled by the first pattern).

In one embodiment, the first masking material 308 may have a rectangular cross-sectional shape in a plane perpendicular to the film thickness direction 302, along the x-z plane. In another embodiment, the first masking material 308 may have a circular cross-sectional shape in the x-z plane.

The substrate 310 may comprise any suitable material known in the art. For the descriptions included below, the substrate 310 comprises Si, and more specifically, crystalline Si.

The first masking material 308 may be used in a final structure as an upper electrode, and may comprise any suitable conductive material known in the art, including W, TaN, TiNi, TiN, etc.

As shown in FIG. 3B, first portions of the substrate 310 are removed using the first mask 328 to form a plurality of pillars 312 that comprise material of the substrate 310. In one embodiment, the substrate 310 may be etched using the first mask 328 to define the cross-sectional shape of the pillars 312 along the x-z plane. Any number of pillars 312 may be formed, and the spacing between the pillars 312 may be different in the x-direction as compared to the z-direction.

Now referring to FIG. 3C, second portions of the substrate 310 are removed to form a plurality of strap regions 330. This procedure may involve a photolithographic step where a mask is formed along the z-direction in order to create the Si strap regions. The strap regions 330 are formed of material from the substrate 310 and are positioned below sets of pillars 312 aligned in a first direction (in FIG. 3C the first direction is the element depth direction 306) along the x-z plane perpendicular to the film thickness direction 302. The strap regions extend above a surface of the substrate 310 in the film thickness direction 302. A plurality of sets of pillars 312 are provided across the surface of the substrate 310, and may be uniformly spaced apart from each other differently in the x-direction versus the z-direction. The formation of the strap regions 330 dictates how many pillars 312 are included in each set of pillars 312 (in FIG. 3C, each set of pillars 312 includes four pillars 312, but considerably more pillars will conceivably be included in each set of pillars 312 connected by a common strap region 330 when in use).

As shown in FIG. 3D, a spacer layer 332 is formed on sides of the first mask 328, sides of the pillars 312, and sides of the strap regions 330. As shown in FIG. 3D, after processing the spacer layer 332 is not positioned above the strap regions 330. Moreover, the spacer layer 332 is not positioned above the substrate 310 except in areas directly around a lower portion of the strap regions 330. However, in initial formation of the spacer layer 332, portions thereof may be positioned above all layers of the structure and then selectively removed using any suitable material removal process known in the art.

In one embodiment, the spacer layer 332 may be formed via isotropic deposition of a dielectric material above and on sides of the first mask 328, the pillars 312, and the strap regions 330, followed by etching of the dielectric material from above the strap regions 330 and above the first mask 328. A width and depth of the spacer layer 332 along the x-z plane gradually decreases at an upper portion of the spacer layer 332 as compared to the lower portion of the spacer layer 332 in the film thickness direction 302.

Now referring to FIG. 3E, a second masking material 334 is formed above the strap regions 330 in the film thickness direction 302 and above third portions of the substrate 310 in the film thickness direction 302 to form a second mask. The third portions of the substrate 310 are positioned between the sets of pillars 312 that are defined by each strap region 330, as shown by the portion of second masking material 334 shown in the bottom view of FIG. 3E.

The second masking material 334 may comprise any suitable masking material known in the art, such as photoresist, $SiO_2$, SiON, $ZrO_2$, $HfO_2$, $Al_2O_3$, etc.

As shown in FIG. 3F, fourth portions of the substrate 310 are removed using the second mask to create voids 314 beneath each of the sets of pillars 312. The fourth portions of the substrate 310 are positioned directly beneath the strap regions 330 in the film thickness direction 302 and comprise all surface areas of the substrate 310 that are not covered by the second mask, but may be covered by another structure (e.g., the strap regions 330).

In one embodiment, isotropic etching and/or vapor etching (such as with $XeF_2$) of the Si material from the substrate 310 may be performed to create the voids. A lower surface of the strap regions 330 is not in contact with any structures (including the substrate 310) except for portions at two ends of each of the sets of pillars 312 after removing the fourth portions of the substrate 310, the two ends being opposite each other in the z-direction as shown in the top view of FIG. 3F.

Now referring to FIG. 3G, an electrode material 316 is formed within the voids (which are no longer shown because they are filled with the electrode material 316) above the substrate 310 and below the strap regions 330 in the film thickness direction 302. After formation of the electrode material 316, the sets of pillars 312 are no longer floating above the substrate 310, as the strap regions 330 are in contact with the electrode material 316.

According to one embodiment, the electrode material 316 may comprise any suitable electrically conductive material known in the art, including W, TaN, TiNi, TiN, etc.

In one embodiment, the electrode material 316 may consist of W, and forming the electrode material 316 may include performing conformal Ti CVD within the voids, transforming portions of the conformal Ti and the substrate 310 positioned therebelow into Ti silicide (TiSi) to act as a TiSi barrier for W deposition thereon, selectively removing portions of the conformal Ti which have not been transformed into TiSi, transforming the TiSi into a nitride (e.g., $TiN_xO_y$, where x and y are proportionally appropriate to create stable forms of titanium nitride), and selectively depositing W onto the $TiN_xO_y$ (and possibly on exposed portions of the TiSi barrier). In this approach, W is not deposited onto any other surfaces besides the $TiN_xO_y$. Of course, any other suitable method of selectively depositing W into the voids may be used as would be apparent to one of skill in the art upon reading the present descriptions.

As shown in FIG. 3H, portions of the electrode material 316 between the sets of pillars 312 are removed using the spacer layer 332 as a mask to form electrodes (shown as electrodes 316) that are positioned beneath the strap regions 330 of each set of pillars 312. This material removal may be performed by an anisotropic etch to selectively remove desired portions of the electrode material 316, as would be understood by one of skill in the art.

Now referring to FIG. 3I, a silicide junction 318 is formed between each of the strap regions (now shown as silicide junctions 318) and a corresponding electrode 316 positioned therebelow.

In one embodiment, when the material of the electrode 316 is W, forming the silicide junction 318 may include heating the material of the electrode 316 and the strap regions to a temperature of at least 750° C. for a predetermined period of time to form $WSi_2$ which constitutes the silicide junction 318. According to a further embodiment, about 35 nm of W material in thickness may be consumed during the silicidation process to form the $WSi_2$, which may be formed at an elevated temperature of about 925° C. for about two minutes, rapid thermal annealing at a temperature in a range from about 900° C. to about 1100° C. for about ten seconds, or some other suitable approach to forming the $WSi_2$ and creating a junction between the electrodes 316 and the pillars 312.

Then, the spacer layer 332 and the second masking material 334 are removed, as shown in FIG. 3J, leaving voids 314 between the electrodes 316. Next, as shown in FIG. 3K, a first insulative layer 320 is formed between the sets of pillars 312 defined by the strap regions (now shown as silicide junctions 318) above the substrate 310 and exposed portions of the electrodes 316 to a height that coincides with a thickness of the strap regions in the film thickness direction 302, but not above the strap regions themselves (or the first insulative layer 320 is removed from above the strap regions after being formed there). The first insulative layer 320 may comprise any suitable material known in the art, such as $SiO_2$, SiON, $ZrO_2$, $HfO_2$, $Al_2O_3$, etc.

As shown in FIG. 3L, a gate dielectric layer 322 is formed above the first insulative layer 320 and on sides of the pillars 312 to a height greater than a lower edge of the first mask 328 in the film thickness direction 302. As shown in FIG. 3L, the gate dielectric layer 322 is formed above all exposed portions of the structure, such as via ALD. The gate dielectric layer 322 may comprise any suitable material known in the art, such as $SiO_2$, SiON, $ZrO_2$, $HfO_2$, $Al_2O_3$, etc.

Now referring to FIG. 3M, a gate layer 324 is formed on the gate dielectric layer 324 to a thickness that is less than a height of the pillars 312 in the film thickness direction 302. In one embodiment, the gate layer 324 may be formed full film, planarized, and etched back to the desired thickness. In one embodiment, the gate layer may comprise any suitable material known in the art, such as doped polysilicon, W, TaN, TiNi, TiN, etc.

As shown in FIG. 3N, portions of the gate layer 324 in a second direction (shown as the element width direction 304, i.e., the x-direction) along the x-z plane and perpendicular to the z-direction to form gate electrodes 324 that transverse a plurality of sets of pillars 312. In other words, the gate electrodes 324 extend across multiple sets of pillars 312 in the x-direction, while the sets of pillars 312 are arranged lined up in the z-direction and share a common strap region.

The portions of the gate layer 324 that are removed are selected in order to electrically isolate the gate electrodes 324 from one another from one pillar 312 to the next adjacent pillar 312 in each set of pillars 312.

Now referring to FIG. 3O, a third insulative layer 326 is formed above the gate electrodes 324 and the gate dielectric layer 322 in the film thickness direction 302 and along sides of the gate dielectric layer 322 and the first mask 328. The first mask 328 (also referred to herein as an upper electrode) is configured to electrically couple to a structure positioned thereabove in some approaches. In one approach, the third insulative layer 326 may formed to a thickness consistent with an upper surface of the first mask 328.

In one such embodiment, a pMTJ may be formed above one or more of the upper electrodes 324 in the film thickness direction 302. In this embodiment, at least one of the nanowires is electrically coupled to the pMTJ. In one further embodiment, a pMTJ may comprise a seed layer, an underlayer positioned above the seed layer, a synthetic antiferromagnetic (SAF) seed layer positioned above the underlayer, a first SAF layer positioned above the SAF seed layer, a spacer layer positioned above the first SAF layer, an antiferromagnetic (AFM) coupling layer positioned above the spacer layer, a second SAF layer positioned above the AFM coupling layer, a ferromagnetic (FM) coupling layer positioned above the second SAF layer, a reference layer that comprises a first reference layer positioned below a second reference layer, a barrier layer positioned above the reference layer, a free layer which includes a lower free layer positioned above the barrier layer, a middle free layer positioned above the lower free layer, and an upper free layer positioned above the middle free layer. The pMTJ may also comprise a first cap layer positioned above the upper free layer, a second cap layer positioned above the first cap layer, a third cap layer positioned above the second cap layer, and a fourth cap layer positioned above the third cap layer.

Figure 4:
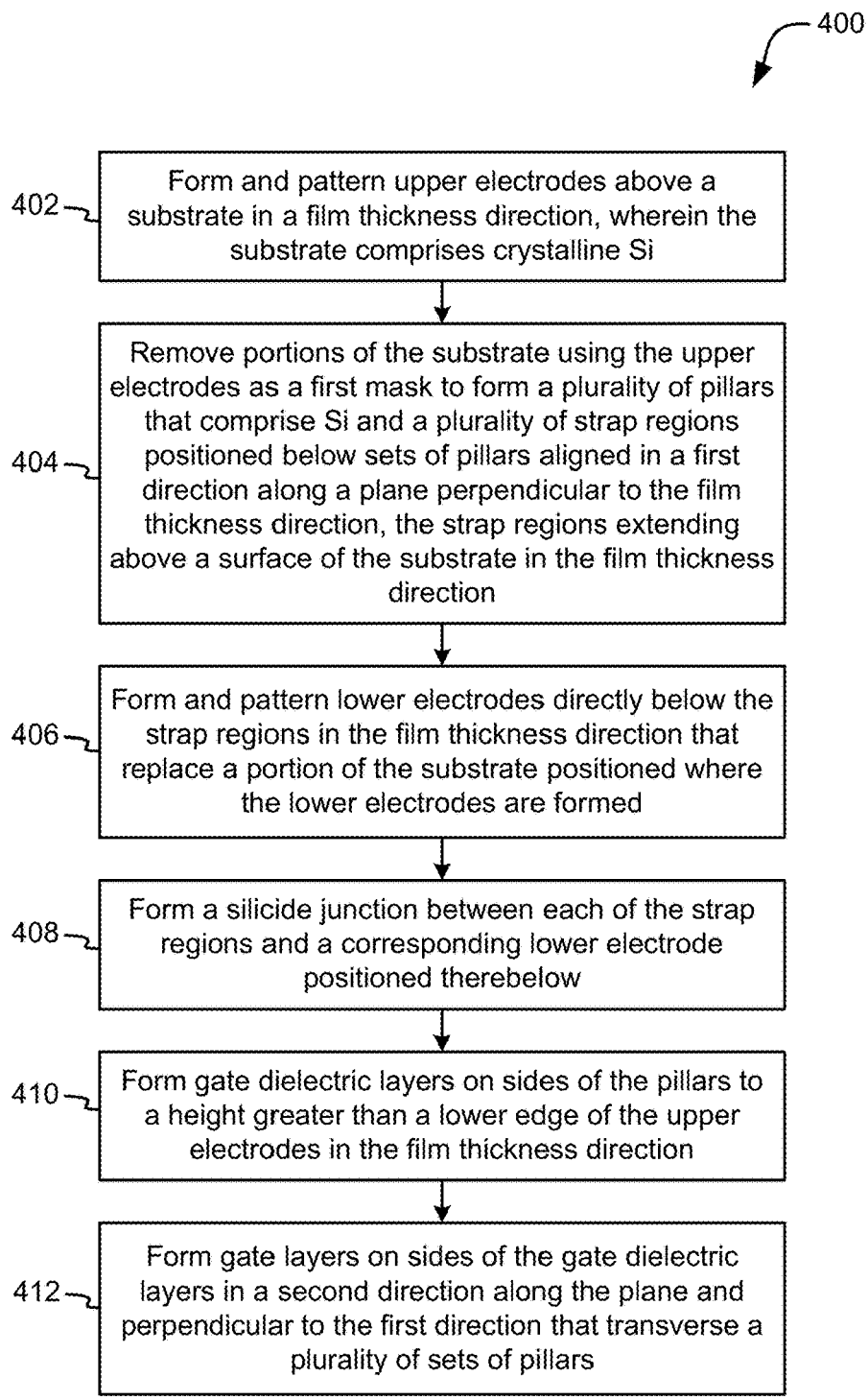
FIG. 4 shows a flow diagram of a method according to one embodiment.

Now referring to FIG. 4, a method 400 is shown according to one embodiment. The method 400 may be performed in accordance with the present invention in any of the environments depicted in FIGS. 1-3O, among others not specifically described, in various approaches. Of course, more or less operations than those specifically described in FIG. 4 may be included in method 400, as would be understood by one of skill in the art upon reading the present descriptions.

Each of the operations of method 400 may be performed by any suitable component of the operating environment. For example, in various embodiments, method 400 may be partially or entirely performed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to perform one or more operations of method 400. Illustrative processing circuits include, but are not limited to, a CPU, an ASIC, a FPGA, etc., combinations thereof, or any other suitable computing device known in the art.

In the descriptions of method 400, each layer may be formed using any known deposition process, such as sputtering, plating, CVD, pCVD, PVD, MBE, ALD, etc. Moreover, any descriptions of removal of layers and/or material may be performed using any material removal process of a type known in the art, such as planarization, CMP, recess etching, RIE, ion milling, plasma etching, photolithography, etc.

Method 400 may begin with operation 402, where upper electrodes are formed and patterned above a substrate in a film thickness direction. The substrate comprises crystalline Si in one approach, while the upper electrodes may comprise W, TaN, TiNi, TiN, etc.

In one embodiment, forming and patterning the upper electrodes may include forming a first masking material above the substrate in the film thickness direction. Thereafter, portions of the first masking material are removed according to a first pattern to form the first mask that comprises a plurality of dots of the first masking material.

In one approach, the first masking material may include any suitable material, such as W, TaN, TiNi, TiN, etc.

In operation 404, portions of the substrate are removed (such as via etching) using the upper electrodes as a first mask to form a plurality of pillars that comprise Si and a plurality of strap regions positioned below sets of pillars aligned in a first direction along a plane perpendicular to the film thickness direction. The strap regions extend above a surface of the substrate in the film thickness direction after processing thereof from the substrate material.

In operation 406, lower electrodes are formed and patterned directly below the strap regions in the film thickness direction that replace a portion of the substrate positioned where the lower electrodes are formed. In one approach, the lower electrodes may comprise any suitable material, such as W, TaN, TiNi, TiN, etc.

In one embodiment, forming and patterning the lower electrodes may comprise forming a spacer layer on sides of the first mask, the pillars, and the strap regions. The spacer layer is not positioned above the strap regions. Thereafter, a masking material may be formed above the strap regions in the film thickness direction and above, in the film thickness direction, first portions of the substrate positioned between the sets of pillars to form a second mask. In addition, second portions of the substrate are removed using the second mask to create voids beneath each of the sets of pillars and an electrode material is formed within the voids above the substrate and below the strap regions in the film thickness direction. Moreover, portions of the electrode material between the sets of pillars are removed using the spacer layer as a mask to form the lower electrodes that are positioned beneath the strap regions. The electrode material may comprise any suitable material known in the art, such as W, TaN, TiNi, TiN, etc.

In a further embodiment, the spacer layer may be formed by isotropic deposition of a dielectric material above and on sides of the first mask, the pillars, and the strap regions. Thereafter, the dielectric material may be etched to remove the dielectric material from positions above the strap regions and positions above the first mask, with a width and depth of the spacer layer along the plane gradually decreasing at an upper portion of the spacer layer as compared to a lower portion of the spacer layer in the film thickness direction.

In another embodiment, removing the second portions of the substrate using the second mask may include isotropic etching and/or vapor etching the Si material from the substrate positioned directly beneath the strap regions in the film thickness direction. In this embodiment, a lower surface of the strap regions is not in contact with any structures (except for portions at two ends of each of the sets of pillars after removing the second portions of the substrate, the two ends being opposite each other in the first direction).

In one approach, when the electrode material comprises W, forming the electrode material may include performing conformal Ti CVD within the voids, transforming portions of the conformal Ti and the substrate positioned therebelow into TiSi to act as a TiSi barrier for W deposition, selectively removing portions of the conformal Ti which have not been transformed into TiSi, transforming the TiSi into a nitride (e.g., $TiN_xO_y$), and selectively depositing W onto the $TiN_xO_y$ and exposed portions of the TiSi barrier. In this embodiment, W is not deposited onto any other surfaces other than those specifically described above.

In operation 408, a silicide junction is formed between each of the strap regions and a corresponding lower electrode positioned therebelow, via any silicide formation technique known in the art.

In another embodiment, when the lower electrodes comprise W, forming the silicide junction may include heating the lower electrodes and the strap regions to a temperature of at least 900° C. for a predetermined period of time to form $WSi_2$, W being drawn into portions of the strap regions from portions of the lower electrodes.

In operation 410, gate dielectric layers are formed on sides of the pillars to a height greater than a lower edge of the upper electrodes in the film thickness direction.

The gate dielectric layers may include any suitable material, such as $SiO_2$, SiON, $ZrO_2$, $HfO_2$, $Al_2O_3$, etc.

In operation 412, gate layers are formed on sides of the gate dielectric layers in a second direction along the plane and perpendicular to the first direction that transverse a plurality of sets of pillars.

In one approach, the gate layers may comprise any suitable material known in the art, such as doped polysilicon, W, TaN, TiNi, TiN, etc.

According to another embodiment, method 400 may include forming an insulative layer above the gate layers and the gate dielectric layers in the film thickness direction and along sides of the gate layers, the gate dielectric layers, and the upper electrodes. In this embodiment, the upper electrodes are configured to electrically couple to at least one structure positioned thereabove.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method, comprising:
   forming a first masking material above a substrate in a film thickness direction, wherein the substrate comprises crystalline silicon (Si);

removing portions of the first masking material according to a first pattern to form a first mask that comprises a plurality of dots of the first masking material;

removing first portions of the substrate using the first mask to form a plurality of pillars that comprise material of the substrate;

removing second portions of the substrate to form a plurality of strap regions, the strap regions being formed of substrate material and positioned below sets of pillars aligned in a first direction along a plane perpendicular to the film thickness direction, wherein the strap regions extend above a surface of the substrate in the film thickness direction;

forming a spacer layer on sides of the first mask, the pillars, and the strap regions, wherein the spacer layer is not positioned above the strap regions;

forming a second masking material above the strap regions in the film thickness direction and above third portions of the substrate in the film thickness direction to form a second mask, the third portions of the substrate being positioned between the sets of pillars;

removing fourth portions of the substrate using the second mask to create voids beneath each of the sets of pillars;

forming an electrode material within the voids above the substrate and below the strap regions in the film thickness direction;

removing portions of the electrode material between the sets of pillars using the spacer layer as a mask to form electrodes that are positioned beneath the strap regions;

forming a silicide junction between each of the strap regions and a corresponding electrode positioned therebelow;

forming a first insulative layer above the substrate to a height that coincides with a thickness of the strap regions in the film thickness direction;

forming a gate dielectric layer above the first insulative layer and on sides of the pillars to a height greater than a lower edge of the first mask in the film thickness direction;

forming a gate layer on the gate dielectric layer; and removing portions of the gate layer in a second direction along the plane and perpendicular to the first direction to form gate electrodes that transverse a plurality of sets of pillars;

wherein removing the fourth portions of the substrate using the second mask comprises:

isotropic etching and/or vapor etching silicon (Si) material from the substrate positioned directly beneath the strap regions in the film thickness direction, wherein a lower surface of the strap regions is not in contact with any structures except for portions at two ends of each of the sets of pillars after removing the fourth portions of the substrate, the two ends being opposite each other in the first direction.

2. The method as recited in claim 1, further comprising forming a second insulative layer above the gate electrodes and the gate dielectric layer in the film thickness direction and along sides of the gate dielectric layer and the first mask, wherein the first mask is configured to electrically couple to a structure positioned thereabove.

3. The method as recited in claim 1,
wherein the first mask comprises at least one material selected from a group consisting of: W, TaN, TiNi, and TiN,
wherein the spacer layer, the first insulative layer, the second masking material, and the gate dielectric layer each comprises at least one material selected from a group consisting of: $SiO_2$, SiON, $ZrO_2$, $HfO_2$, and $Al_2O_3$,
wherein the electrode material comprises at least one material selected from a group consisting of: W, TaN, TiNi, and TiN, and
wherein the gate layer comprises at least one material selected from a group consisting of: doped polysilicon, W, TaN, TiNi, and TiN.

4. The method as recited in claim 1, wherein the electrode material is W, and wherein forming the silicide junction comprises heating the electrode material and the strap regions to a temperature of at least 750° C. for a predetermined period of time to form $WSi_2$.

5. The method as recited in claim 1, wherein forming the spacer layer comprises:
isotropic deposition of a dielectric material above and on sides of the first mask, the pillars, and the strap regions; and
etching the dielectric material from above the strap regions and above the first mask,
wherein a width and depth of the spacer layer along the plane gradually decreases at an upper portion of the spacer layer as compared to a lower portion of the spacer layer in the film thickness direction.

6. The method as recited in claim 1, wherein the electrode material comprises W, and wherein forming the electrode material comprises:
performing conformal Ti chemical vapor deposition (CVD) within the voids;
transforming portions of the conformal Ti and the substrate positioned therebelow into Ti silicide (TiSi) to act as a TiSi barrier for W deposition;
selectively removing portions of the conformal Ti which have not been transformed into TiSi;
transforming the TiSi into a nitride ($TiN_xO_y$); and
selectively depositing W onto the $TiN_xO_y$ and exposed portions of the TiSi barrier, with the proviso that W is not deposited onto any other surfaces.

7. A method, comprising:
forming and patterning upper electrodes above a substrate in a film thickness direction, wherein the substrate comprises crystalline silicon (Si);
removing portions of the substrate using the upper electrodes as a first mask to form a plurality of pillars that comprise silicon (Si) and a plurality of strap regions positioned below sets of pillars aligned in a first direction along a plane perpendicular to the film thickness direction, the strap regions extending above a surface of the substrate in the film thickness direction;
forming and patterning lower electrodes directly below the strap regions in the film thickness direction that replace a portion of the substrate positioned where the lower electrodes are formed;
forming a silicide junction between each of the strap regions and a corresponding lower electrode positioned therebelow;
forming gate dielectric layers on sides of the pillars to a height greater than a lower edge of the upper electrodes in the film thickness direction;
forming gate layers on sides of the gate dielectric layers in a second direction along the plane and perpendicular to the first direction that transverse a plurality of sets of pillars and;
forming an insulative layer above the gate layers and the gate dielectric layers in the film thickness direction and along sides of the gate layers, the gate dielectric layers, and the upper electrodes, wherein the upper electrodes are configured to electrically couple to at least one structure positioned thereabove.

8. The method as recited in claim 7,
wherein the upper electrodes comprise at least one material selected from a group consisting of: W, TaN, TiNi, and TiN,
wherein the gate dielectric layers comprise at least one material selected from a group consisting of: $SiO_2$, SiON, $ZrO_2$, $HfO_2$, and $Al_2O_3$,
wherein the lower electrodes comprise at least one material selected from a group consisting of: W, TaN, TiNi, and TiN, and
wherein the gate layers comprise at least one material selected from a group consisting of: doped polysilicon, W, TaN, TiNi, and TiN.

9. The method as recited in claim 7, wherein forming and patterning the upper electrodes comprises:
forming a first masking material above the substrate in the film thickness direction; and
removing portions of the first masking material according to a first pattern to form the first mask that comprises a plurality of dots of the first masking material, the first masking material comprising at least one material selected from a group consisting of: W, TaN, TiNi, and TiN.

10. The method as recited in claim 7, wherein forming and patterning the lower electrodes comprises:
forming a spacer layer on sides of the first mask, the pillars, and the strap regions, wherein the spacer layer is not positioned above the strap regions;
forming a masking material above the strap regions in the film thickness direction and above, in the film thickness direction, first portions of the substrate positioned between the sets of pillars to form a second mask;
removing second portions of the substrate using the second mask to create voids beneath each of the sets of pillars;
forming an electrode material within the voids above the substrate and below the strap regions in the film thickness direction, the electrode material comprising at least one material selected from a group consisting of: W, TaN, TiNi, and TiN; and
removing portions of the electrode material between the sets of pillars using the spacer layer as a mask to form the lower electrodes that are positioned beneath the strap regions.

11. The method as recited in claim 10, wherein forming the spacer layer comprises:
isotropic deposition of a dielectric material above and on sides of the first mask, the pillars, and the strap regions; and
etching the dielectric material to remove the dielectric material from positions above the strap regions and positions above the first mask,
wherein a width and depth of the spacer layer along the plane gradually decreases at an upper portion of the spacer layer as compared to a lower portion of the spacer layer in the film thickness direction.

12. The method as recited in claim 10, wherein removing the second portions of the substrate using the second mask comprises:
isotropic etching and/or vapor etching Si material from the substrate positioned directly beneath the strap regions in the film thickness direction, wherein a lower surface of the strap regions is not in contact with any structures except for portions at two ends of each of the sets of pillars after removing the second portions of the substrate, the two ends being opposite each other in the first direction.

13. The method as recited in claim 10, wherein the electrode material comprises W, and wherein forming the electrode material comprises:
performing conformal Ti chemical vapor deposition (CVD) within the voids;
transforming portions of the conformal Ti and the substrate positioned therebelow into Ti silicide (TiSi) to act as a TiSi barrier for W deposition;
selectively removing portions of the conformal Ti which have not been transformed into TiSi;
transforming the TiSi into a nitride ($TiN_xO_y$); and
selectively depositing W onto the $TiN_xO_y$ and exposed portions of the TiSi barrier, with the proviso that W is not deposited onto any other surfaces.

14. The method as recited in claim 7, wherein the lower electrodes comprise W, and wherein forming the silicide junction comprises:
heating the lower electrodes and the strap regions to a temperature of at least 750° C. for a predetermined period of time to form $WSi_2$, W being drawn into portions of the strap regions from portions of the lower electrodes.

* * * * *